(12) United States Patent
Chiang et al.

(10) Patent No.: US 12,218,082 B2
(45) Date of Patent: Feb. 4, 2025

(54) PACKAGE STRUCTURE

(71) Applicant: Taiwan Semiconductor Manufacturing Company, Ltd., Hsinchu (TW)

(72) Inventors: Kai-Ming Chiang, Hsinchu (TW); Chao-wei Li, Hsinchu (TW); Wei-Lun Tsai, Hsinchu (TW); Chia-Min Lin, Hsinchu (TW); Yi-Da Tsai, Chiayi Country (TW); Sheng-Feng Weng, Taichung (TW); Yu-Hao Chen, HsinChu (TW); Sheng-Hsiang Chiu, Tainan (TW); Chih-Wei Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/506,111

(22) Filed: Nov. 9, 2023

(65) Prior Publication Data
US 2024/0071954 A1    Feb. 29, 2024

Related U.S. Application Data

(63) Continuation of application No. 17/389,313, filed on Jul. 29, 2021, now Pat. No. 11,855,006.

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............. H01L 23/3128; H01L 23/3135; H01L 25/0652; H01L 25/50; H01L 2225/06541;
(Continued)

(56) References Cited

U.S. PATENT DOCUMENTS 9,000,584 B2    4/2015    Lin et al.
9,048,222 B2    6/2015    Hung et al.
(Continued)

*Primary Examiner* — Kyoung Lee
*Assistant Examiner* — Christina A Sylvia
(74) *Attorney, Agent, or Firm* — JCIPRNET

(57) ABSTRACT

A memory device including a base semiconductor die, conductive terminals, memory dies, an insulating encapsulation and a buffer cap is provided. The conductive terminals are disposed on a first surface of the base semiconductor die. The memory dies are stacked over a second surface of the base semiconductor die, and the second surface of the base semiconductor die is opposite to the first surface of the base semiconductor die. The insulating encapsulation is disposed on the second surface of the base semiconductor die and laterally encapsulates the memory dies. The buffer cap covers the first surface of the base semiconductor die, sidewalls of the base semiconductor die and sidewalls of the insulating encapsulation. A package structure including the above-mentioned memory device is also provided.

20 Claims, 28 Drawing Sheets

(51) Int. Cl.
*H01L 21/56* (2006.01)
*H01L 21/683* (2006.01)
*H01L 23/31* (2006.01)
*H01L 23/538* (2006.01)
*H01L 25/00* (2006.01)
*H01L 25/065* (2023.01)

(52) U.S. Cl.
CPC .......... *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 25/0652* (2013.01); *H01L 25/50* (2013.01); *H01L 2221/68372* (2013.01); *H01L 2225/06541* (2013.01); *H01L 2225/06586* (2013.01)

(58) Field of Classification Search
CPC . H01L 2221/68372; H01L 2221/68345; H01L 2221/68359; H01L 2224/16145; H01L 2224/16146; H01L 2224/18; H01L 2224/32145; H01L 2224/73204; H01L 2224/94; H01L 2924/181; H01L 2924/18161
See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2016/0013115 | A1* | 1/2016 | Vadhavkar .......... H01L 23/3675 257/713 |
| 2016/0148909 | A1* | 5/2016 | Chung .............. H01L 21/76898 257/778 |
| 2018/0012865 | A1* | 1/2018 | Schrock ............. H01L 23/4334 |

* cited by examiner

PACKAGE STRUCTURE

CROSS-REFERENCE TO RELATED APPLICATION

This application is a continuation application of and claims the priority benefit of a prior application Ser. No. 17/389,313, filed on Jul. 29, 2021 and now allowed. The entirety of the above-mentioned patent application is hereby incorporated by reference herein and made a part of this specification.

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
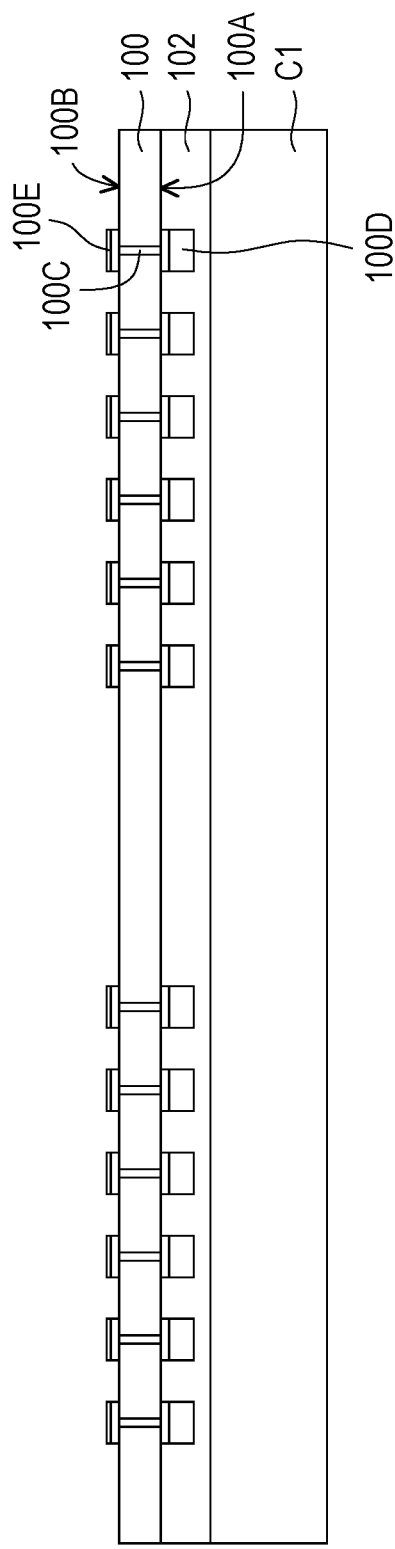
FIGS. 1 through 11 schematically illustrate cross-sectional views of various processing steps during fabrication of high bandwidth memory (HBM) devices in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 11 schematically illustrate cross-sectional views of various processing steps during fabrication of high bandwidth memory (HBM) devices in accordance with some embodiments.

Referring to FIG. 1, a semiconductor wafer 100 is provided and attached to a carrier C1. In some embodiments, the semiconductor wafer 100 is attached to the carrier C1 through an adhesion layer 102. In some embodiments, the carrier C1 includes silicon substrate, quartz substrate, ceramic substrate, glass substrate, a combination thereof, or the like, and provides mechanical support for subsequent operations performed on the semiconductor wafer 100. In some embodiments, the adhesion layer 102 includes a light to heat conversion (LTHC) material, a UV adhesive, a polymer layer, a combination thereof, or the like, and the adhesion layer 102 is formed through a spin-on coating process, a printing process, a lamination process, a combination thereof, or the like.

In some embodiments, the semiconductor wafer 100 includes a semiconductor substrate (not individually shown), one or more active and/or passive devices (not individually shown) on the semiconductor substrate, and an interconnect structure (not individually shown) over the one or more active and/or passive devices and the semiconductor substrate. In some embodiments, the semiconductor substrate may be formed of silicon, although it may also be formed of other group III, group IV, and/or group V elements, such as germanium, gallium, arsenic, and combinations thereof. The semiconductor substrate may also be in the form of silicon-on-insulator (SOI). The SOI substrate may include a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In some embodiments, the semiconductor wafer 100 further includes one or more active and/or passive devices (not individually shown) formed on the substrate. The one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like.

The interconnect structure may include stacked dielectric layers (such an inter-layer dielectric (ILD)/inter-metal dielectric layers (IMDs)) and interconnect wirings (such as conductive lines and vias) between in the stacked dielectric layers. The stacked dielectric layers may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, the interconnect wirings may be formed in the stacked dielectric layers using, for example, a damascene process, a dual damascene process, a combination thereof, or the like. In some embodiments, the interconnect wirings include copper wirings, silver wirings, gold wirings, tungsten wirings, tantalum wirings, aluminum wirings, a combination thereof, or the like. In some embodiments, the interconnect wirings provide electrical connections between the one or more active and/or passive devices formed on the substrate.

In some embodiments, the semiconductor wafer 100 further includes through vias 100C that extend from a first surface 100A of the semiconductor wafer 100 toward a second surface 100B of the semiconductor wafer 100. In some embodiments, the through vias 100C may be formed by forming through holes in the semiconductor wafer 100 and filling the through holes with suitable conductive materials. In some embodiments, the through holes are formed using suitable photolithography and etching methods. In some embodiments, the through holes are filled with copper, a copper alloy, silver, gold, tungsten, tantalum, aluminum, a combination thereof, or the like, using physical vapor deposition (PVD), atomic layer deposition (ALD), electro-chemical plating, electroless plating, or a combination thereof, the like. In some embodiments, a liner layer and/or an adhesive/barrier layer may be formed in the through holes before filling the through holes with suitable conductive materials. In some embodiments, a planarization process may be performed to remove excess portions of the conductive material (i.e., excess conductive material located outside the through holes). The planarization process may include a chemical mechanical polishing (CMP) process, a grinding process, an etching process, a combination thereof, or the like.

In some embodiments, the semiconductor wafer 100 further includes conductive terminals 100D formed on the first surface 100A of the semiconductor wafer 100 and conductive terminals 100E formed on the second surface 100B of the semiconductor wafer 100. In some embodiments, the conductive terminals 100D include conductive pillars and solder material over the conductive pillars. The conductive pillars may include conductive material such as copper, tungsten, aluminum, silver, gold, a combination thereof, or the like. The solder material may include lead-based solders such as PbSn compositions, lead-free solders including InSb, tin, silver, and copper ("SAC") compositions, and other eutectic materials that have a common melting point and form conductive solder connections in electrical applications. For lead-free solders, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

In some embodiments, a method of forming the conductive pillars may include forming a conductive seed layer over the first surface 100A, forming a photoresist material over the conductive seed layer, patterning the photoresist material to form openings in the photoresist layer, depositing a conductive material in the openings using an electro-chemical plating process, an electroless plating process, ALD, PVD, a combination thereof, or the like, removing the photoresist layer, and removing exposed portions of the conductive seed layer. In some embodiments, before removing the photoresist layer, a solder material is formed over the conductive material of the conductive pillars in the openings using evaporation, an electro-chemical plating process, an electroless plating process, printing, solder transfer, a combination thereof, or the like. In some embodiments, the conductive terminals 100E may be similar to and may be forming using similar materials and methods as the conductive terminals 100D and the description is not repeated herein. In some embodiments, the conductive terminals 100E includes conductive pillars and a solder material over the conductive pillars. In some embodiments, the conductive pillars of the conductive terminals 100E may be formed using similar materials and methods as the conductive pillars of the conductive terminals 100D and the description is not repeated herein. In some embodiments, the solder material of the conductive terminals 100E may be formed using similar materials and methods as the solder material of the conductive terminals 100D and the description is not repeated herein.

In some embodiment, the semiconductor wafer 100 may be an interposer wafer. In such embodiments, the semiconductor wafer 100 may not include the one or more active and/or passive devices on the semiconductor substrate. In other embodiments, the semiconductor wafer 100 may be an IC wafer. In such embodiments, the semiconductor wafer 100 includes the one or more active and/or passive devices on the semiconductor substrate.

Figure 2:
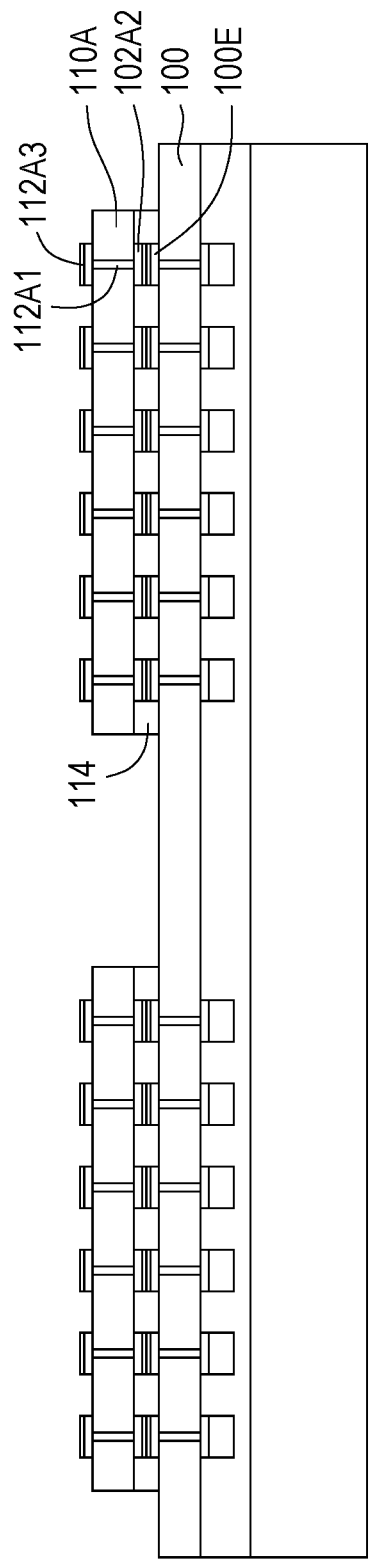

Referring to FIG. 2, memory dies 110A are picked-up and placed on the second surface 100B of the semiconductor wafer 100. Each of the memory dies 110A may include a semiconductor substrate (not individually illustrated), one or more active and/or passive devices (not individually illustrated) on the semiconductor substrate, and an interconnect structure (not individually illustrated) over the semiconductor substrate and the one or more active and/or passive devices. In some embodiments, the semiconductor substrates of the memory dies 110A may be formed using similar materials and method as the substrate of the semiconductor wafer 100 described above with reference to FIG. 1 and the description is not repeated herein. In some embodiments, the one or more active and/or passive devices of the memory dies 110A may be formed using similar materials and method as the one or more active and/or passive devices of the semiconductor wafer 100 described above with reference to FIG. 1 and the description is not repeated herein. In some embodiments, the interconnect structure of the memory dies 110A may be formed using similar materials and method as the interconnect structure of the semiconductor wafer 100 described above with reference to FIG. 1 and the description is not repeated herein. In some embodiments, the memory dies 110A have thickness between about 20 m and about 50 m.

In some embodiments, each of the memory dies 110A further includes through vias 112A1 that extend from a lower surface of the memory die 110A toward an upper surface of the memory die 110A, conductive terminals 112A2 on the lower surface of the memory die 110A, and conductive terminals 112A3 on the upper surface of the memory die 110A. In some embodiments, the through vias 112A1 may be formed using similar materials and methods as the through vias 100C described above with reference to FIG. 1 and the description is not repeated herein. In some embodiments, the conductive terminals 112A2 and the conductive terminals 112A3 may be similar to and may be formed using similar materials and methods as the conductive terminals 100D described above with reference to FIG. 1 and the description is not repeated herein. In some embodiments, each of the conductive terminals 112A2 includes a conductive pillar and a solder material over the conductive pillar. In some embodiments, the conductive pillars of the conductive terminals 112A2 and the conductive terminals 112A3 are formed using similar materials and methods as the conductive pillars of the conductive terminal 100D described above with reference to FIG. 1 and the description is not repeated herein. In some embodiments, the solder material of the conductive terminals 112A2 and the conductive terminals 112A3 is formed using similar materials and methods as the solder material of the conductive terminal 100D described above with reference to FIG. 1 and the description is not repeated herein.

A gap filling material 114 may be formed on a surface of the memory dies 110A before placing the memory dies 110A on the semiconductor wafer 100. In some embodiments, the gap filling material 114 pre-bonds the memory dies 110A to the semiconductor wafer 100. The gap filling material 114 may be non-conductive film (NCF), non-conductive paste (NCP) or the like. In some embodiments, the memory dies 110A are aligned with respect to the conductive terminals 100E of the semiconductor wafer 100 such that the conductive terminals 112A2 of the memory dies 110A are aligned with and placed on the conductive terminals 100E of the semiconductor wafer 100. In some embodiments, during placing the memory dies 110A on the semiconductor wafer 100 or after placing the memory dies 110A on the semiconductor wafer 100 but before placing additional memory dies on the memory dies 110A, no additional external force (such as a force different from the gravitational force due to a weight of the memory dies 110A) is applied to the memory dies 110A. In some embodiments, during placing the memory dies 110A on the semiconductor wafer 100 or after placing the memory dies 110A on the semiconductor wafer 100 but before placing additional memory dies on the memory dies 110A, no additional process steps are performed to pre-bond or bond the conductive terminals 112A2 of the memory dies 110A to the conductive terminals 100E of the semiconductor wafer 100.

Figure 3:
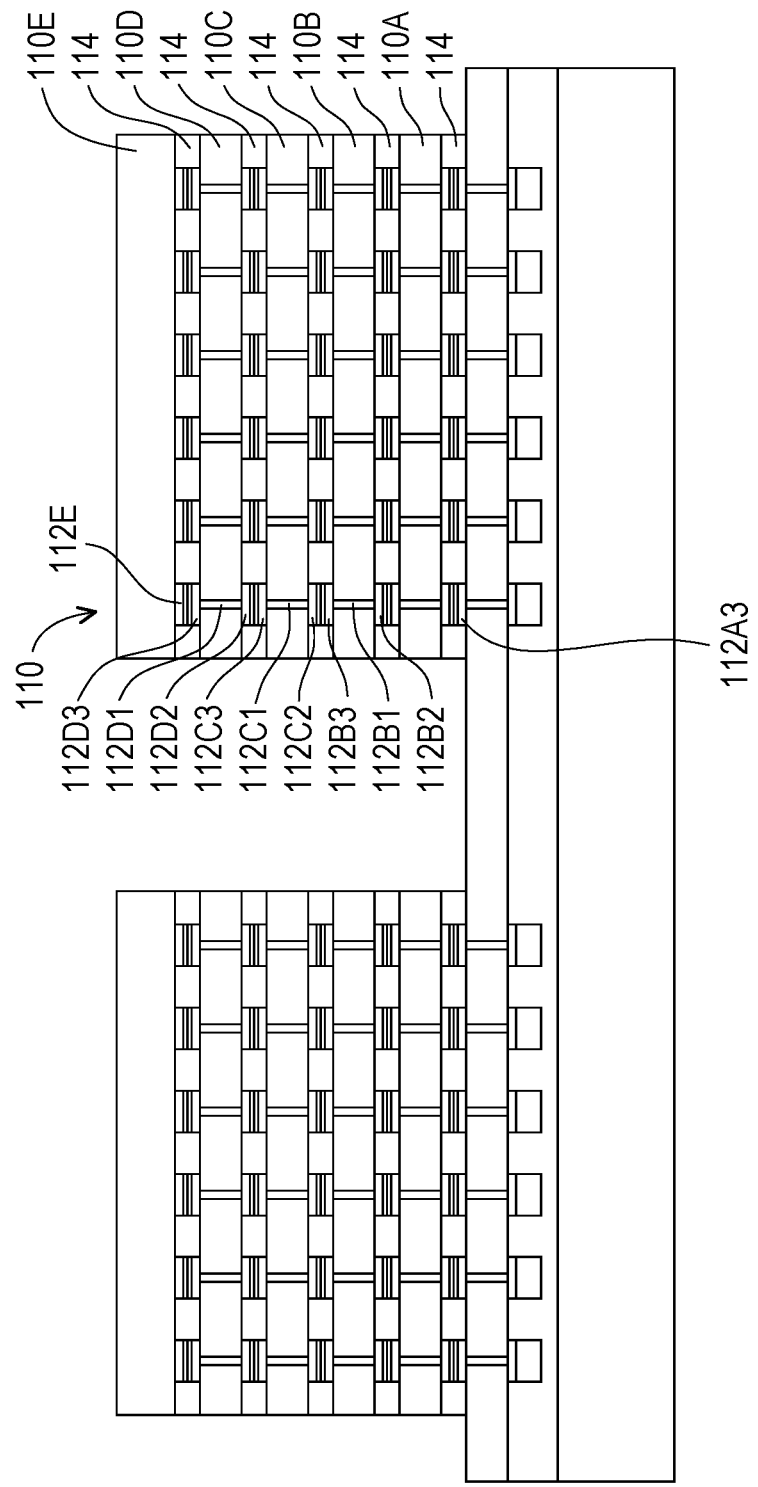

Referring to FIG. 3, memory dies 110B, 110C, 110D and 110E are placed and stacked over the respective memory dies 110A to form pre-bonded die stacks 110 on the semiconductor wafer 100. The number of the tires of the memory dies 110B, 110C, 110D and 110E is not limited. More than or less than four tires of memory dies may be included in each pre-bonded die stack 110. In some embodiments, the memory dies 1101B, 110C, 110D and 110E may be similar to the memory dies 110A described above with reference to FIG. 2 and the description is not repeated herein. As illustrated in FIG. 3, each of the memory dies 110B may further includes through vias 112B1 that extend from lower surfaces of the memory dies 110B toward upper surfaces of the memory dies 110B, conductive terminals 112B2 disposed on the lower surfaces of the memory dies 110B, and conductive terminals 112B3 disposed on the upper surfaces of the memory dies 1101B; each of the memory dies 110C may further includes through vias 112C1 that extend from lower surfaces of the memory dies 110C toward upper surfaces of the memory dies 110C, conductive terminals 112C2 disposed on the lower surfaces of the memory dies 110C, and conductive terminals 112C3 disposed on the upper surfaces of the memory dies 110C; and each of the memory dies 110D may further includes through vias 112D1 that extend from lower surfaces of the memory dies 110D toward upper surfaces of the memory dies 110D, conductive terminals 112D2 disposed on the lower surfaces of the memory dies 110D, and conductive terminals 112D3 disposed on the upper surfaces of the memory dies 110D. Each of the conductive terminals 112B2, 112B3, 112C2, 112C3, 112D2 and 112D3 may include a conductive pillar and a solder material over the conductive pillar. In some embodiments, the conductive pillars of the conductive terminals 112B2, 112B3, 112C2, 112C3, 112D2 and 112D3 are formed using similar materials and methods as the conductive pillars of the conductive terminals 112A3 described above with reference to FIG. 2 and the description is not repeated herein. In some embodiments, the solder material of the conductive terminals 112B2, 112B3, 112C2, 112C3, 112D2 and 112D3 is formed using similar materials and methods as the solder material of the conductive terminals 112A3 described above with reference to FIG. 2 and the description is not repeated herein. In some embodiments, the memory dies 110A, 110B, 110C and 110D have the same thickness. In some other embodiments, the memory dies 110A, 110B, 110C and 110D have different thicknesses.

As illustrated in FIG. 3, the memory dies 110E may perform similar function with the memory dies 110A, 110B, 110C and 110D. The memory dies 110E may have a greater thickness than each of the memory dies 110A, 110B, 110C and 110D. In some embodiments, each of the memory dies 110E further includes conductive terminals 112E on the lower surfaces of the memory dies 110E. Each of the conductive terminals 112E includes a conductive pillar and a solder material over the conductive pillar. In some embodiments, the conductive pillars of the conductive terminals 112E may be formed using similar materials and methods as the conductive pillars of the conductive terminals 100E described above with reference to FIG. 2 and the description is not repeated herein. In some embodiments, the solder material of the conductive terminals 112E may be formed using similar materials and methods as the solder material of the conductive terminals 100E described above with reference to FIG. 1 and the description is not repeated herein.

Referring further to FIG. 3, the memory dies 110B, 110C, 110D and 110E are stacked over the respective memory dies 110A using a method similar to the method of placing memory dies 110A on the semiconductor wafer 100 described above with reference to FIG. 2 and the description is not repeated herein. In some embodiments, a gap filling material 114 is formed on bottom surfaces of the memory dies 110B, 110C, 110D and 110E before the memory dies are placed over previous memory dies to form pre-bonded die stacks 110. In some embodiments, the gap filling material 114 pre-bonds adjacent memory dies (such as memory dies 110A and 110B, memory dies 110B and 110C, memory dies 110C and 110D, memory dies 110D and 110E) of the pre-bonded die stack 110. In some embodiment, during the formation of the pre-bonded die stack 110, no additional external force (such as a force different from the gravitational force due to a weight of the memory dies) is applied to the memory dies 110B, 110C, 110D and 110E. In some embodiments, during the formation of the pre-bonded die stack 110, no additional process steps are performed to pre-bond or bond the conductive terminals 112A3 to the conductive terminals 112B2, the conductive terminals 112B3 to the conductive terminals 112C2, the conductive terminals 112C3 to the conductive terminals 112D2, and the conductive terminals 112D3 to the conductive terminals 112E.

Figure 4:
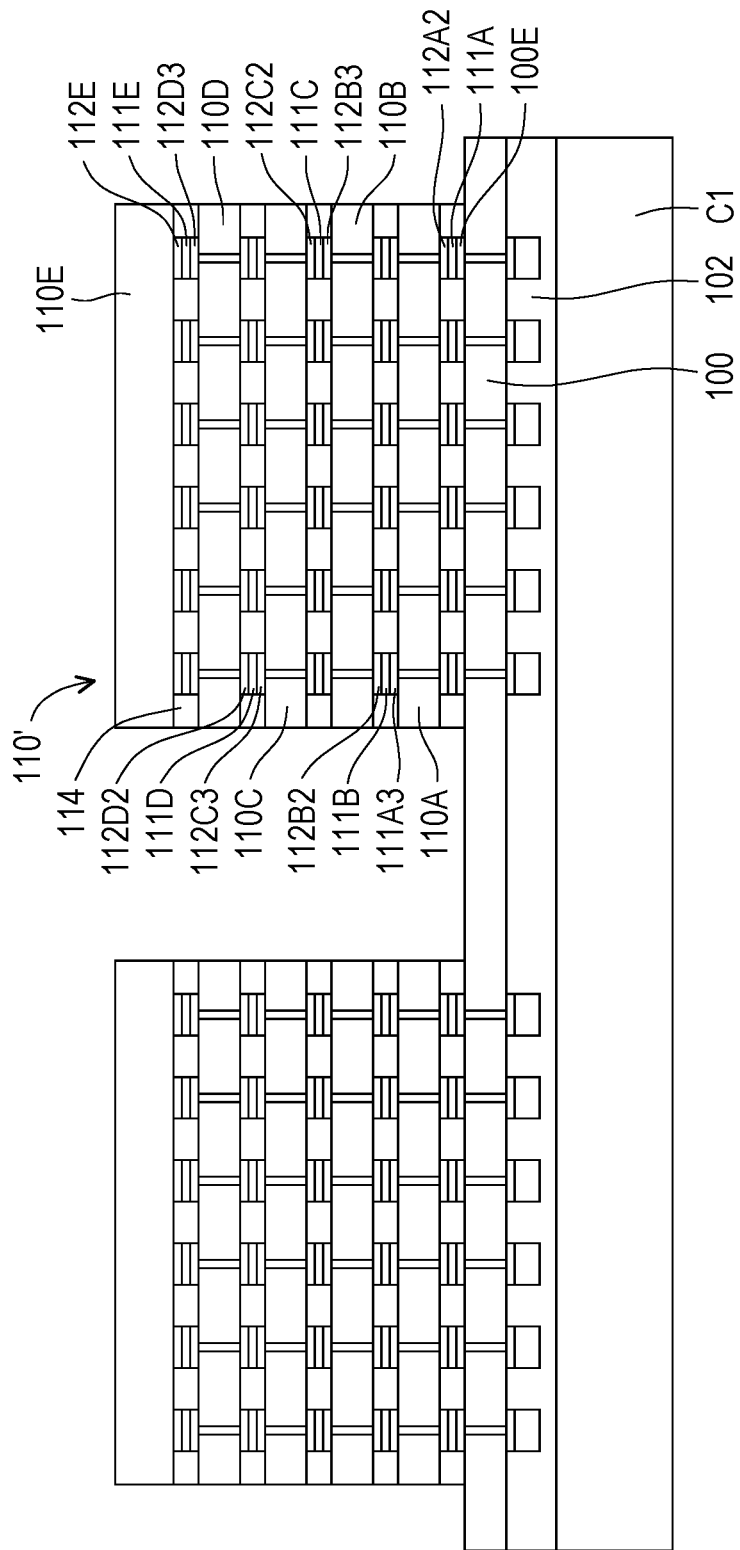

Referring to FIG. 4, a single bonding process is performed on the pre-bonded die stacks 110 to form bonded die stacks 110'. In some embodiment, the single bonding process is a solder reflow process. The single bonding process reflows and bonds each of the conductive terminals 112A2 to a respective one of the conductive terminals 100E to form solder joints 111A, each of the conductive terminals 112B2 to a respective one of the conductive terminals 112A3 to form solder joints 111B, each of the conductive terminals 112C2 to a respective one of the conductive terminals 112B3 to form solder joints 111C, each of the conductive terminals 112D2 to a respective one of the conductive terminals 112C3 to form solder joints 111D, and each of the conductive terminals 112E to a respective one of the conductive terminals 112D3 to form solder joints 111E. For each of the bonded die stacks 110', the single bonding process mechanically and electrically connects the memory dies 110A, 110B, 110C, 110D and 110D to each other. In some embodiments, the bonded die stacks 110' include high bandwidth memory (HBM) cubes.

In some embodiment, during performing the single bonding process, no additional external force (such as a force different from the gravitational force due to a weight of the memory dies 110A, 110B, 110C, 110D and 110D) is applied to the pre-bonded die stacks 110 (see FIG. 3). In other embodiments, the single bonding process is a thermal compression bonding process, or the like.

As illustrated in FIG. 4, the gap filling material 114 not only laterally encapsulates and protects conductive terminals 100E, 112A2, 112A3, 112B2, 112B3, 112C2, 112C3, 112D2, 112D3 and 112E, but also reduces joint failure of the solder joints 111A, 110B, 11C, 111D and 111D. Accordingly, warpage control and reliability of the bonded die stacks 110' may be enhanced by the gap filling material 114.

Figure 5:
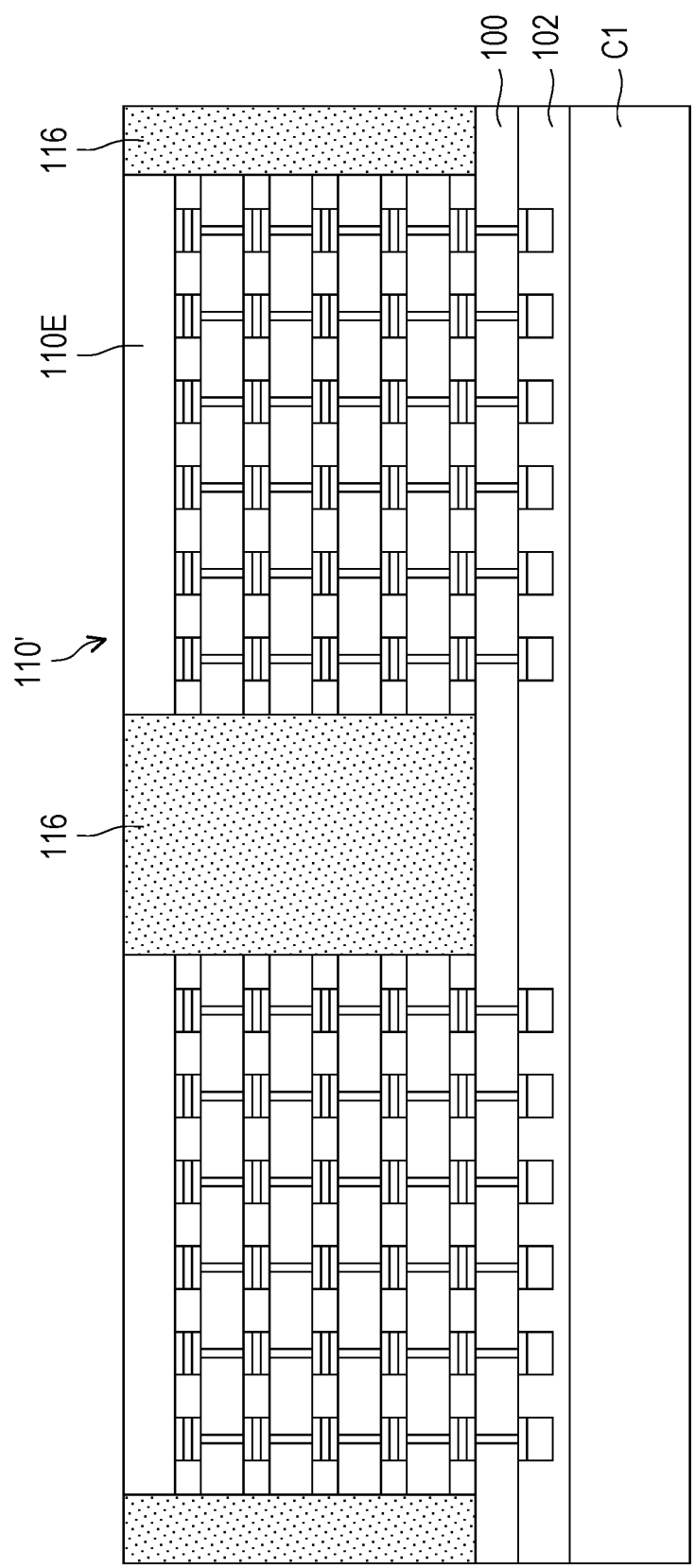

Referring to FIG. 5, after forming the bonded die stacks 110', an insulating encapsulation 116 is formed over the semiconductor wafer 100 to laterally encapsulate and surround the bonded die stacks 110'. In some embodiments, the insulating encapsulation 116 includes a molding compound, such as an epoxy, a resin, a moldable polymer, a combination thereof, or the like, with fillers dispersed therein. The molding compound may be applied while substantially liquid, and then may be cured through a chemical reaction. The fillers may include insulating fibers, insulating particles, other suitable elements, a combination thereof, or the like. In some other embodiments, the insulating encapsulation 116 may be an ultraviolet (UV) or thermally cured polymer applied as a gel or malleable solid capable of being disposed around and between the bonded die stacks 110'. In yet other embodiments, the insulating encapsulation 116 may include a dielectric material, such as an oxide, for example. A planarization process may be performed on the insulating encapsulation 116 to remove excess portions of the insulating encapsulation 116, such that a topmost surface of the insulating encapsulation 116 is substantially level with topmost surfaces of the bonded die stacks 110'. In some embodiments, the planarization process may also remove upper portions of the memory dies 110E and thin the memory dies 110E. The planarization process may include a CMP process, an etching process, grinding, a combination thereof, or the like.

Figure 6:
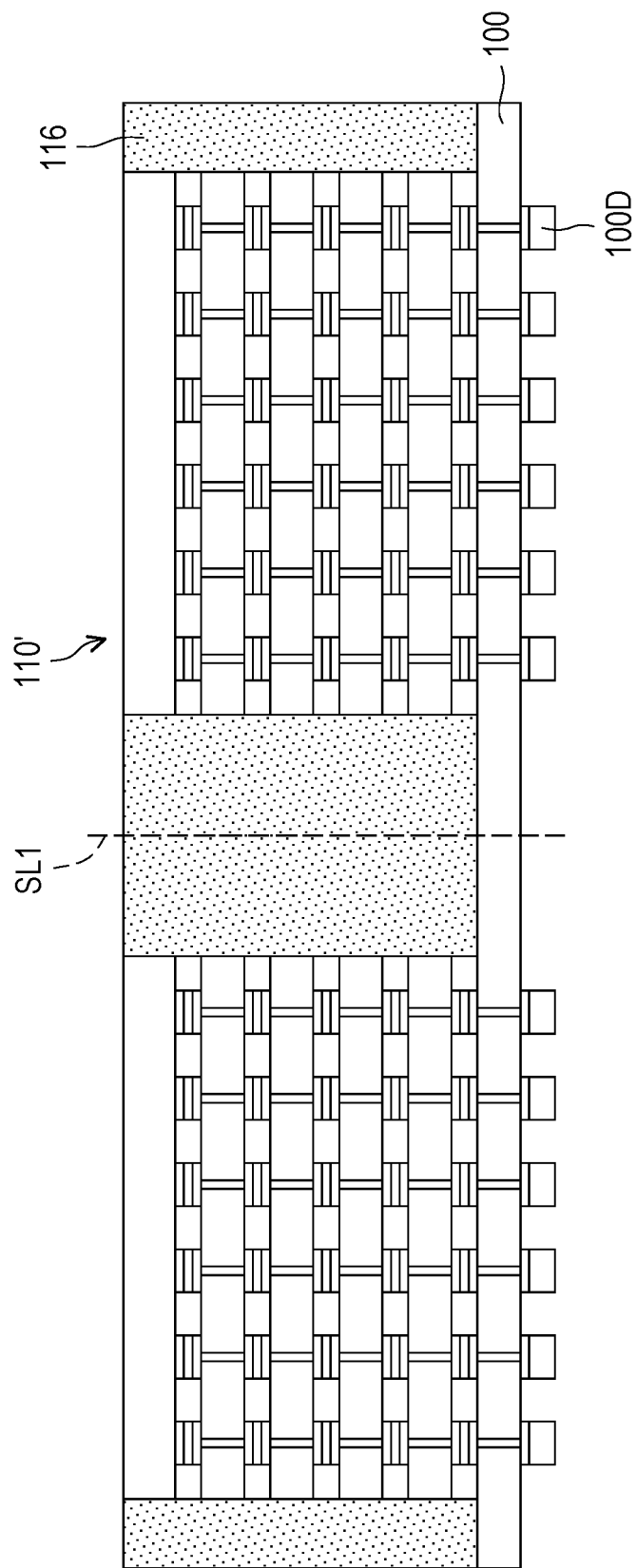

Referring to FIG. 6, after forming the insulating encapsulation 116, the carrier C1 is de-bonded from the semiconductor wafer 100. In some embodiments, after de-bonding the carrier C1 from the semiconductor wafer 100, the adhesion layer 102 is then removed to reveal the conductive terminals 100D. In some embodiments, the adhesion layer 102 is removed using a suitable cleaning process.

Figure 7:
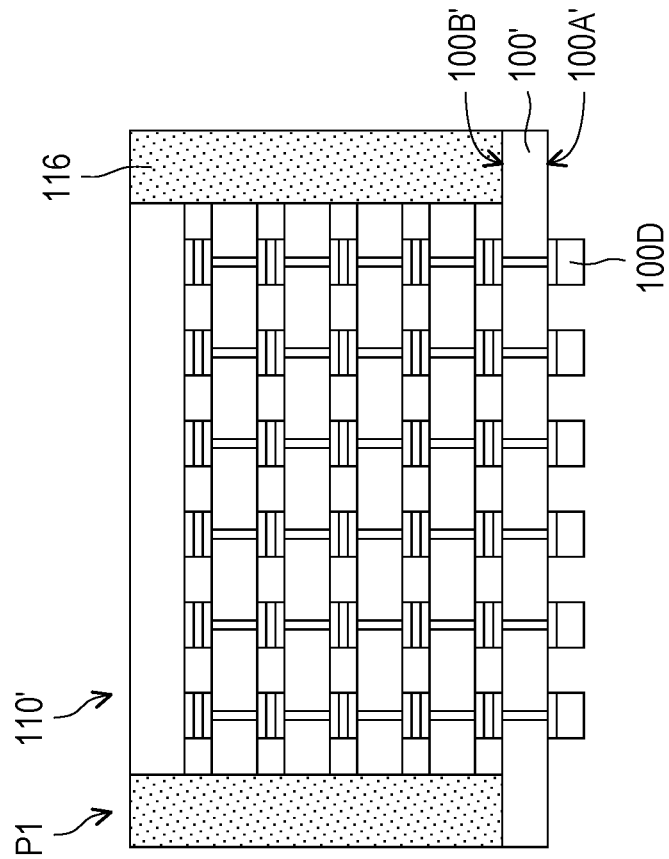
Figure 7:
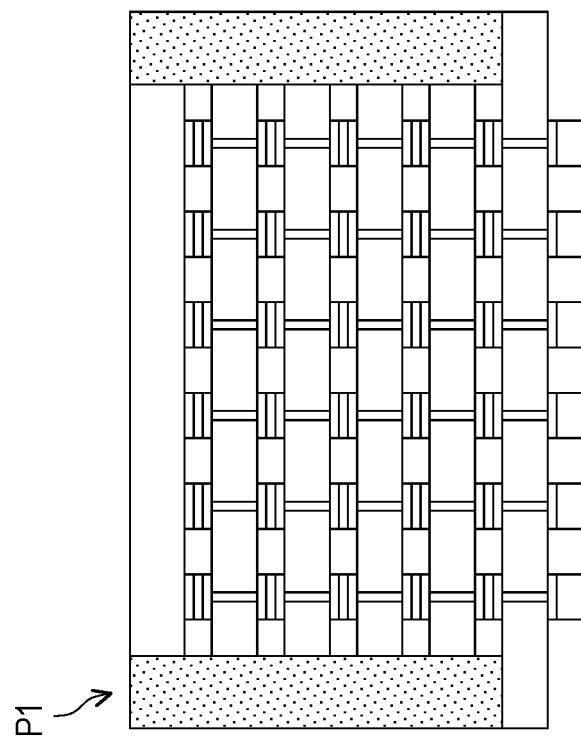

Referring to FIG. 6 and FIG. 7, after de-bonding the carrier C1 from the semiconductor wafer 100, a singulation process is performed along the scribe line SL1 to cut the insulating encapsulation 116 and the semiconductor wafer 100 such that singulated electronic devices P1 are obtained. The insulating encapsulation 116 and the semiconductor wafer 100 may be cut, for example, by mechanical sawing, laser ablation, etching, a combination thereof, or the like. In some embodiments, each of the singulated electronic devices P1 includes a base semiconductor die 100', a bonded die stack 110' disposed on the base semiconductor die 100', an insulating encapsulation 116' disposed on the base semiconductor die 100' and laterally encapsulating the bonded die stack 110'. The base semiconductor die 100' includes a first surface 100A' and a second surface 100B'. The conductive terminals 100D are distributed on and protrude from the first surface 100A' of the base semiconductor die 100'. The bonded die stack 110' is disposed on the second surface 100B' of the base semiconductor die 100'. The bonded die stack 110' includes memory dies 110A, 110B, 110C, 110D and 110E (FIG. 4) stacked over and electrically connected to the base semiconductor die 100'. The insulating encapsulation 116' is disposed on the second surface 100B' of the base semiconductor die 100' and laterally encapsulating the bonded die stack 110'. As illustrated in FIG. 7, the thickness of the insulating encapsulation 116' is substantially equal to the thickness of the bonded die stack 110', and sidewalls of the base semiconductor die 100' are substantially aligned with sidewalls of the insulating encapsulation 116'. The topmost surface of the insulating encapsulation 116 may be substantially level with the top surface of the memory die 110E. Furthermore, the width of the base semiconductor die 100' is greater than the width of the memory dies in the bonded die stack 110'.

Figure 8:
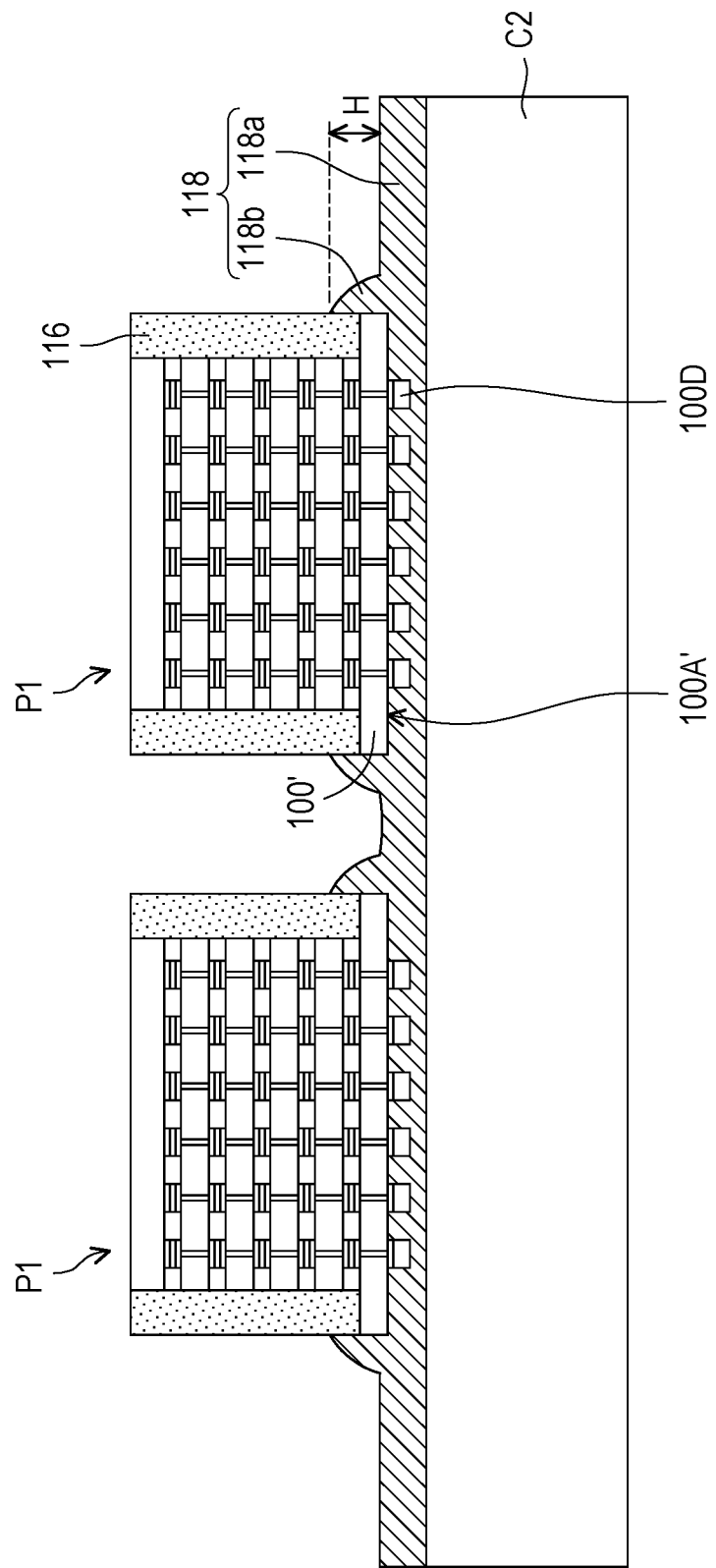

Referring to FIG. 8, a first buffer material layer 118 is formed over a carrier C2. The first buffer material layer 118 may include a die attachment film (DAF), a glue, a paste or the like. The first buffer material layer 118 may be a soft material layer or a flexible material layer, and the first buffer material layer 118 may be an optically or thermally curable material layer. The singulated electronic devices P1 are picked-up and placed onto the first buffer material layer 118 carried by the carrier C2. Then, the electronic devices P1 are pressed, for example, by a pick-up and placement tool such that the electronic devices P1 are partially sunken into the first buffer material layer 118. The thickness T of the first buffer material layer 118 is thicker than the height of the conductive terminals 100D, and the conductive terminals 100D are spaced apart from the carrier C2 by the first buffer material layer 118. In some embodiments, the first buffer material layer 118 may have thickness T between about 35 m and about 100 m. When the electronic devices P1 are pressed and partially sunken into the first buffer material layer 118, the first buffer material layer 118 may be extruded and deform to cover portions of the sidewalls of the electronic devices P1. After the electronic devices P1 are pressed and partially sunken into the first buffer material layer 118, the top surface (e.g., the first surfaces 100A' of the base semiconductor dies 100') of the electronic devices P1 on which the conductive terminals 100D are disposed, the conductive terminals 100D and the portions of the sidewalls of the electronic devices P1 are covered by the first buffer material layer 118.

After the electronic devices P1 are pressed and partially sunken into the first buffer material layer 118, the first buffer material layer 118 is cured such that the electronic devices P1 can be fixed on the first buffer material layer 118 carried by the carrier C2. In an embodiment where the first buffer material layer 118 includes an optically curable material layer (e.g., an ultraviolet curable material), the first buffer material layer 118 is cured by an optical curing process (e.g., irradiation of ultraviolet light). In another embodiment where the first buffer material layer 118 includes a thermally curable material layer, the first buffer material layer 118 is cured by a thermal curing process.

After the first buffer material layer 118 is cured, the deformed first buffer material layer 118 includes a base portion 118a and a ring-shaped protruding portion 118b protruding from the base portion 118a. In some embodiments, the base portion 118a covers the first surface 100A' of the base semiconductor die 100' and laterally encapsulates the conductive terminals 100D distributed on the first surface 100A', and the ring-shaped protruding portion 118b extends from the base portion 118a to cover the sidewalls of the base semiconductor die 100' and the portions of the sidewalls of the insulating encapsulation 116'. In another embodiment, not illustrated in figures, the ring-shaped protruding portion extends from the base portion to entirely cover the sidewalls of the base semiconductor die, but the ring-shaped protruding portion is not in contact with the sidewalls of the insulating encapsulation. In yet another embodiment, not illustrated in figures, the ring-shaped protruding portion extends from the base portion to cover merely portions of the sidewalls of the base semiconductor die, but the ring-shaped protruding portion is not in contact with the sidewalls of the insulating encapsulation.

As illustrated in FIG. 8, the top surface of the base portion 118a is located at a level height which is higher than that of the first surface 100A' of the base semiconductor die 100'. In some other embodiments, not illustrated in figures, the top surface of the base portion is located at a level height which is lower than or level with the first surface of the base semiconductor die.

In some embodiments, the ring-shaped protruding portion 118b includes a convex surface in contact with the second buffer material layer 120. In some other embodiments, the ring-shaped protruding portion 118b includes a rounded and convex surface. The ring-shaped protruding portion 118b may have height H between about 1 m and about 600 m.

Figure 9:
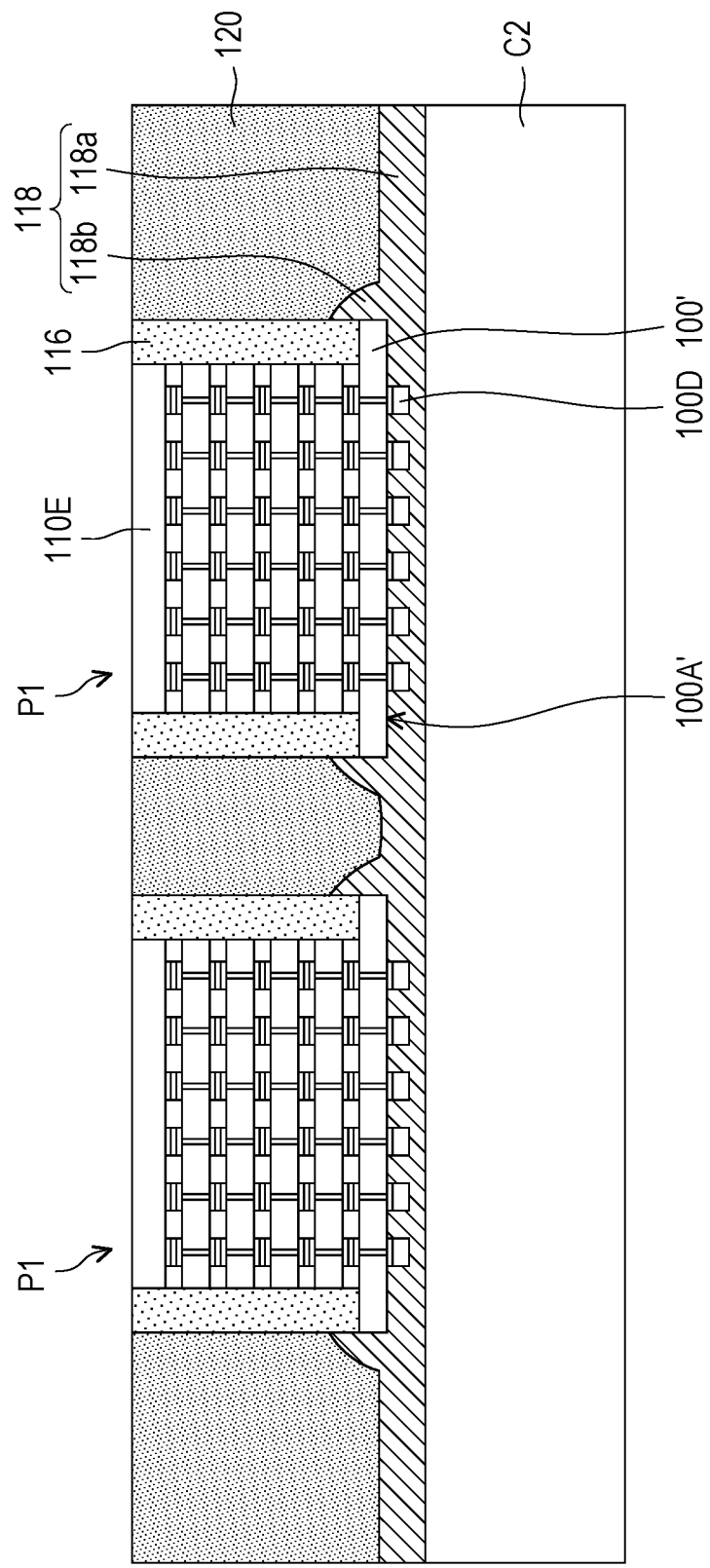

Referring to FIG. 9, a second buffer material layer 120 is formed on the first buffer material layer 118 to fill gaps between the electronic devices P1 and laterally encapsulate the electronic devices P1. The second buffer material layer 120 covers portions of the sidewalls of the electronic device P which is not covered by the ring-shaped protruding portion 118b of the first buffer material layer 118. In some embodiments, the second buffer material layer 120 includes a molding compound, such as an epoxy, a resin, a moldable polymer, a combination thereof, or the like, with fillers dispersed therein. The molding compound may be applied while substantially liquid, and then may be cured through a chemical reaction. The fillers may include insulating fibers, insulating particles, other suitable elements, a combination thereof, or the like. In some other embodiments, the second buffer material layer 120 may be an ultraviolet (UV) or thermally cured polymer applied as a gel or malleable solid capable of being disposed around and between the bonded die stacks 110'. In yet other embodiments, the second buffer material layer 120 may include a dielectric material, such as an oxide, for example. A planarization process may be performed on the second buffer material layer 120 to remove excess portions of the second buffer material layer 120 such that the top surface of the second buffer material layer 120 is substantially level with the top s of the electronic devices P1. The planarization process may include a CMP process, an etching process, grinding, a combination thereof, or the like.

As illustrated in FIG. 9, the second buffer material layer 120 covers and in contact with the sidewalls of the insulating encapsulations 116'. Furthermore, the top surface of the second buffer material layer 120 may be substantially level with the top surface of the memory dies 110E and top surfaces of the insulating encapsulations 116'. The second buffer material layer 120 is spaced apart from the base semiconductor die 100' by the ring-shaped protruding portion 118b of the first buffer material layer 118. In other embodiments where the ring-shaped protruding portion extends from the base portion to cover merely portions of the sidewalls of the base semiconductor die, the second buffer material layer is in contact with the sidewalls of the base semiconductor die.

After forming the second buffer material layer 120, a wafer level structure including the electronic devices P1, the first buffer material layer 118 and the second buffer material layer 120 is formed over the carrier C2.

Figure 10:
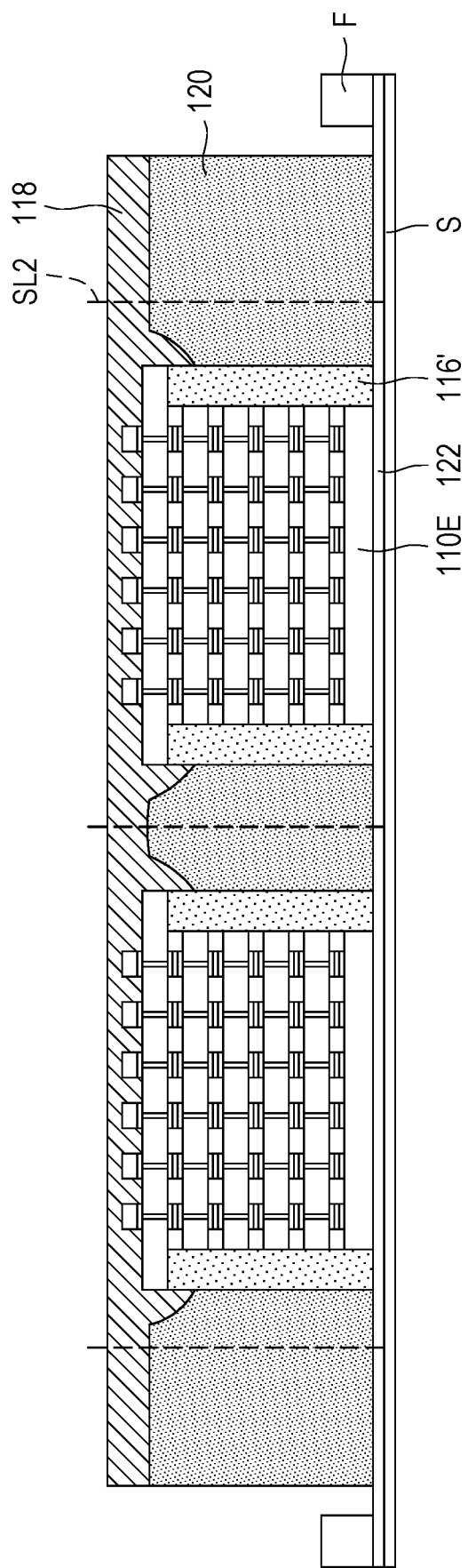

Referring to FIG. 9 and FIG. 10, the wafer level structure is de-bonded from the carrier C2 and a frame mount process is performed such that the wafer level structure is transferred to a sawing tape S carried by a frame F. In some embodiments, an adhesion layer 122 is provided and attached to the sawing tape S carried by the frame F, and the wafer level structure is bonded to the adhesion layer 122. As illustrated in FIG. 10, the memory die 110E, the insulating encapsulation 116' and the second buffer material layer 120 are attached to the adhesion layer 122.

Figure 11:
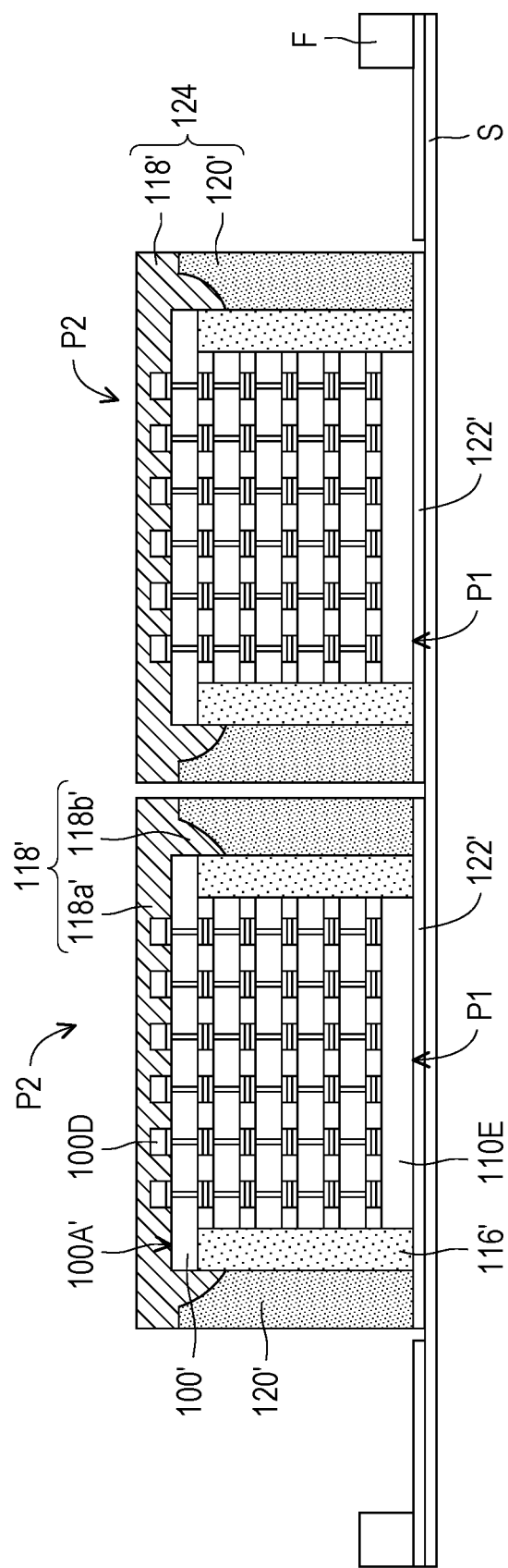

Referring to FIG. 10 and FIG. 11, a singulation process (e.g., a sawing process) is performed along the scribe lines SL2 to cut the first buffer material layer 118, the second buffer material layer 120 and the adhesion layer 122 such that singulated package structures P2 (e.g., HBM devices) are obtained. The first buffer material layer 118 and the second buffer material layer 120 may be cut, for example, by mechanical sawing, laser ablation, etching, a combination thereof, or the like.

As illustrated in FIG. 11, each of the singulated package structures P2 includes an electronic device P1 and a buffer cap 124. The electronic device P1 includes a top surface (e.g., the first surfaces 100A' of the base semiconductor dies 100'), and the electronic device P1 includes conductive terminals 100D distributed on the top surface of the electronic device P1. The buffer cap 124 covers the top surface and sidewalls of the electronic device P1. The buffer cap 124 includes a first buffer layer 118' and a second buffer layer 120'. The first buffer layer 118' covers the top surface of the electronic device P1 and upper portions of the sidewalls of the electronic device P1, and the conductive terminals 1010D are embedded in the first buffer layer 118'. The second buffer layer 120' covers bottom portions of the sidewalls of the electronic device P1, and sidewalls of the first buffer layer 118' substantially align with sidewalls of the second buffer layer 120'. In some embodiments, the first buffer layer 118' includes a base portion 118a' and a ring-shaped protruding portion 118b' protruding from the base portion 118a', wherein the base portion 118a' covers the first surface 100A' of the base semiconductor die 100' and laterally encapsulating the conductive terminals 100D, the ring-shaped protruding portion 118b' extends from the base portion 118a' to cover the sidewalls of the base semiconductor die 100' and the upper portions of the sidewalls of the insulating encapsulation 116'. In some embodiments, the ring-shaped protruding portion 118b' includes a convex surface (e.g., a rounded and convex surface) in contact with the second buffer layer 120'. In some embodiments, the package structure P2 further includes an adhesion layer 122' in contact with the memory die 110E of the electronic device P1 and the second buffer layer 120' of the buffer cap 124, wherein sidewalls of the adhesion layer 122' is substantially aligned with sidewalls of the buffer cap 124.

As illustrated in FIG. 11, the base portion 118a' of the first buffer layer 118' covers the first surface 100A' of the base semiconductor die 100' and laterally encapsulates the conductive terminals 100D distributed on the first surface 100A', and the ring-shaped protruding portion 118b' of the first buffer layer 118' extends from the base portion 118a' to cover the sidewalls of the base semiconductor die 100' and the portions of the sidewalls of the insulating encapsulation 116'. In another embodiment, not illustrated in figures, the ring-shaped protruding portion extends from the base portion to entirely cover the sidewalls of the base semiconductor die, but the ring-shaped protruding portion is not in contact with the sidewalls of the insulating encapsulation. In yet another embodiment, not illustrated in figures, the ring-shaped protruding portion extends from the base portion to cover merely portions of the sidewalls of the base semiconductor die, but the ring-shaped protruding portion is not in contact with the sidewalls of the insulating encapsulation.

As illustrated in FIG. 8, the top surface of the base portion 118a' of the first buffer layer 118' is located at a level height which is lower than that of the first surface 100A' of the base semiconductor die 100'. In some other embodiments, not illustrated in figures, the top surface of the base portion is located at a level height which is higher than or level with the first surface of the base semiconductor die.

In some embodiments, the ring-shaped protruding portion 118b' of the first buffer layer 118' includes a convex surface. In some other embodiments, the ring-shaped protruding portion 118b' of the first buffer layer 118' includes a rounded and convex surface. The ring-shaped protruding portion 118b' of the first buffer layer 118' may have height H between about 1 m and about 600 μm.

FIGS. 12 through 15 schematically illustrate cross-sectional views of various processing steps during fabrication of HBM devices in accordance with some other embodiments.

Figure 12:
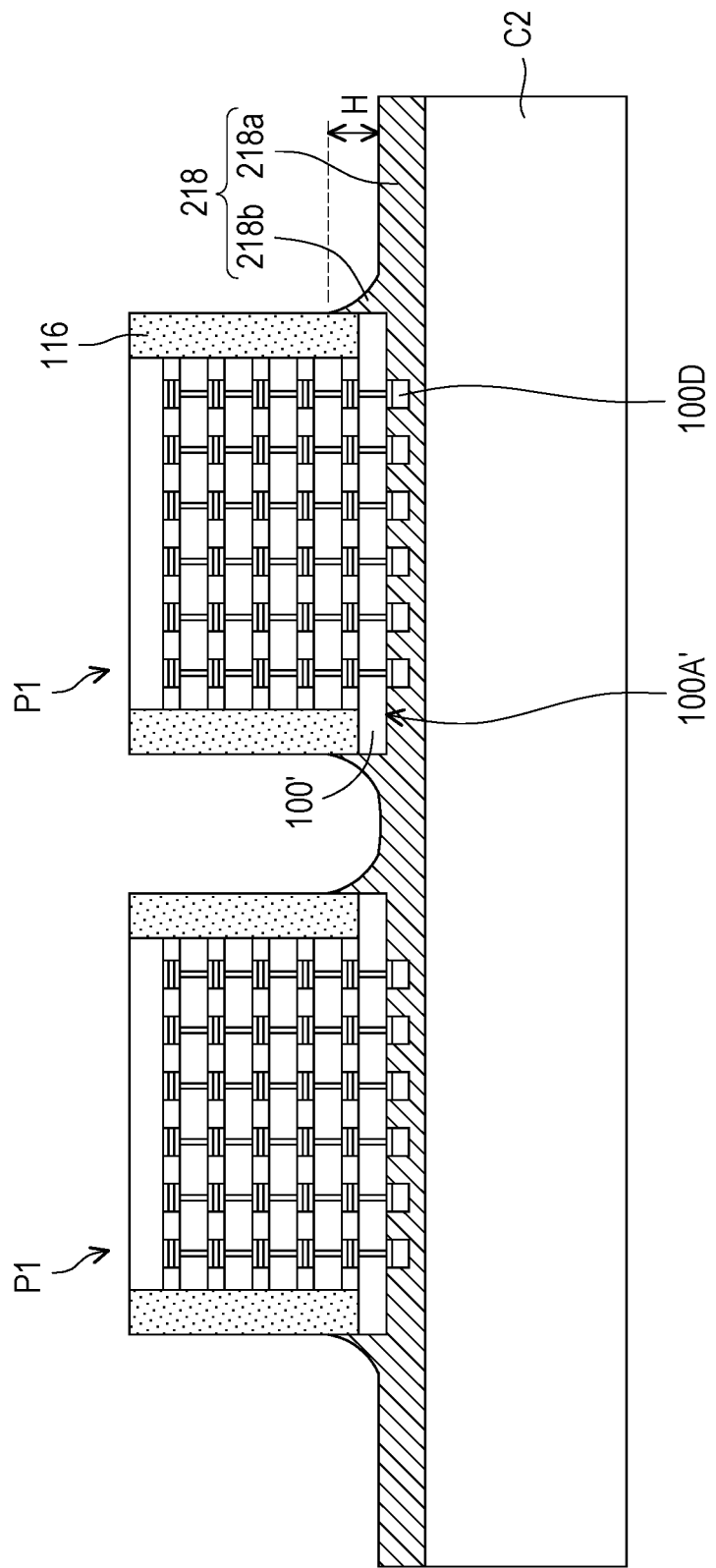
FIGS. 12 through 15 schematically illustrate cross-sectional views of various processing steps during fabrication of HBM devices in accordance with some other embodiments.
Figure 13:
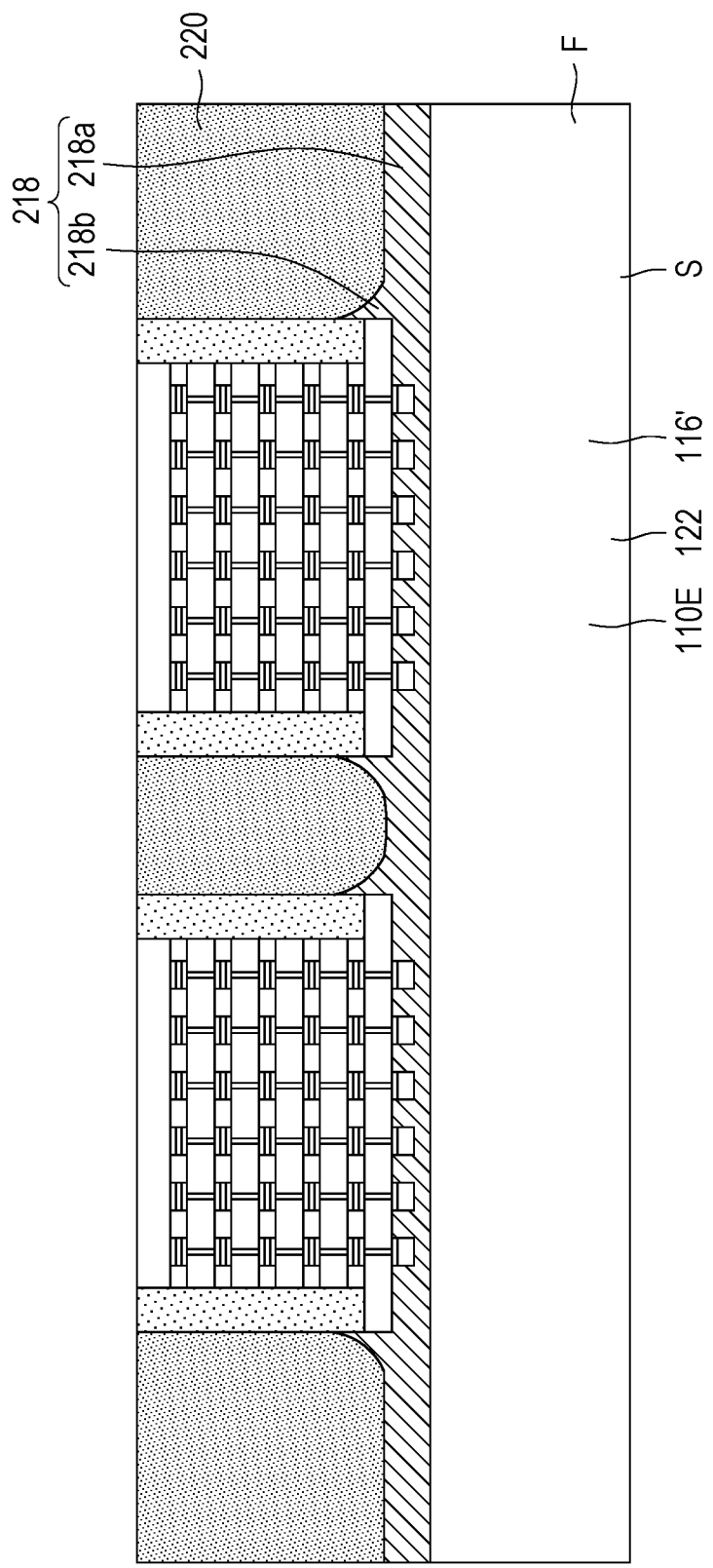
Figure 14:
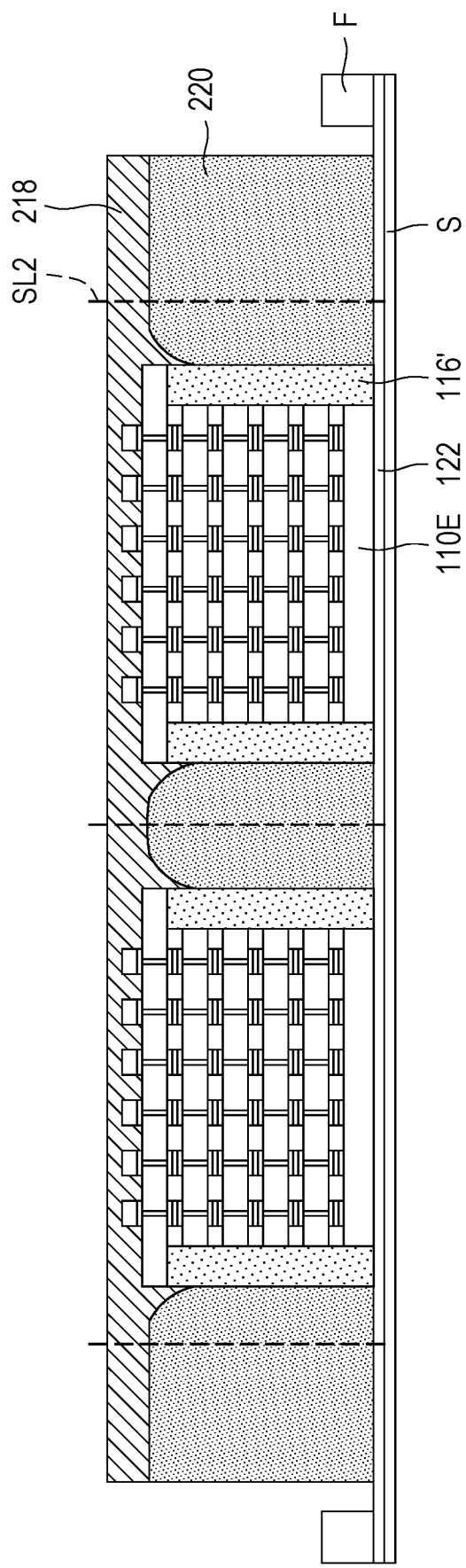
Figure 15:
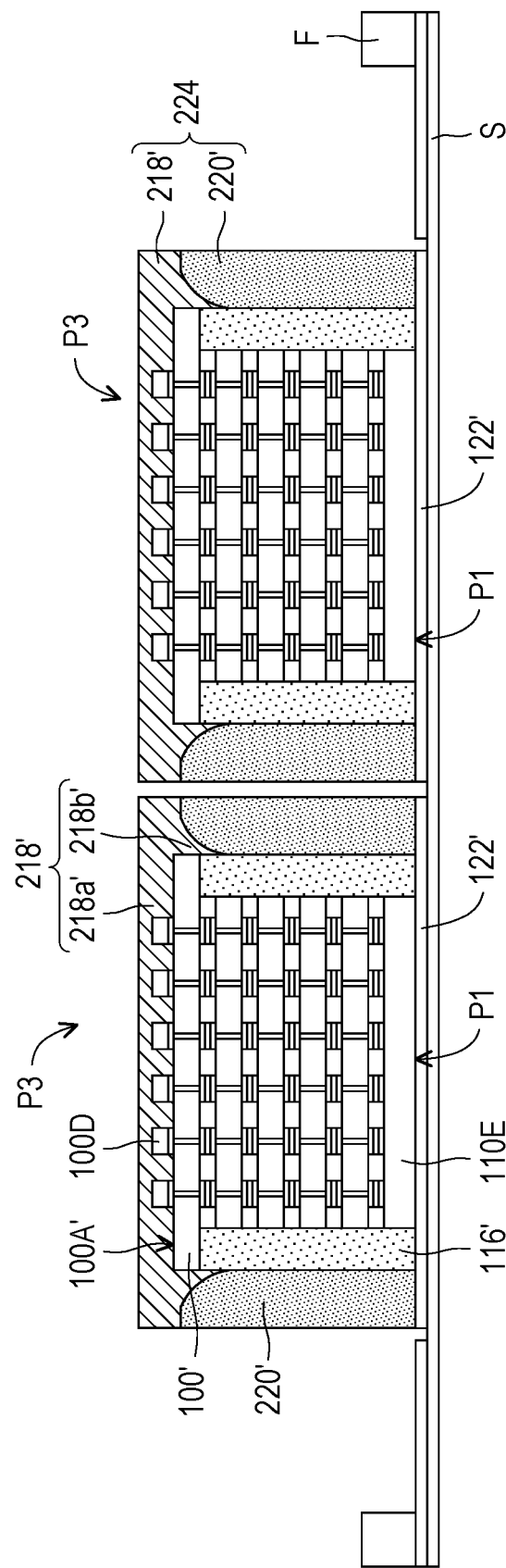

Referring to FIGS. 8 through 11 and FIGS. 12 through 15, the processing steps illustrated in FIGS. 12 through 15 are similar with the processing steps illustrated in FIGS. 8 through 11 except that the profile of the first buffer material layer 218 and the configuration of the buffer cap 224. As illustrated in FIGS. 12 through 14, the first buffer material layer 218 is covered by the second buffer material layer 220, the first buffer material layer 218 includes a base portion 218a and a ring-shaped protruding portion 218b, wherein the ring-shaped protruding portion 218b includes a concave surface in contact with the second buffer material layer 220. In some embodiments, the ring-shaped protruding portion 218b includes a rounded and concave surface in contact with the second buffer material layer 220. As illustrated in FIG. 15, in the singulated package structure P3, the buffer cap 224 includes a first buffer layer 218' and a second buffer layer 220', wherein the first buffer layer 218' includes a base portion 218a' and a ring-shaped protruding portion 218b'. The ring-shaped protruding portion 218b' includes a concave surface in contact with the second buffer layer 220'. In some embodiments, the ring-shaped protruding portion 218b' includes a rounded and concave surface in contact with the second buffer layer 220'.

FIGS. 16 through 19 schematically illustrate cross-sectional views of various processing steps during fabrication of HBM devices in accordance with some alternative embodiments.

Figure 16:
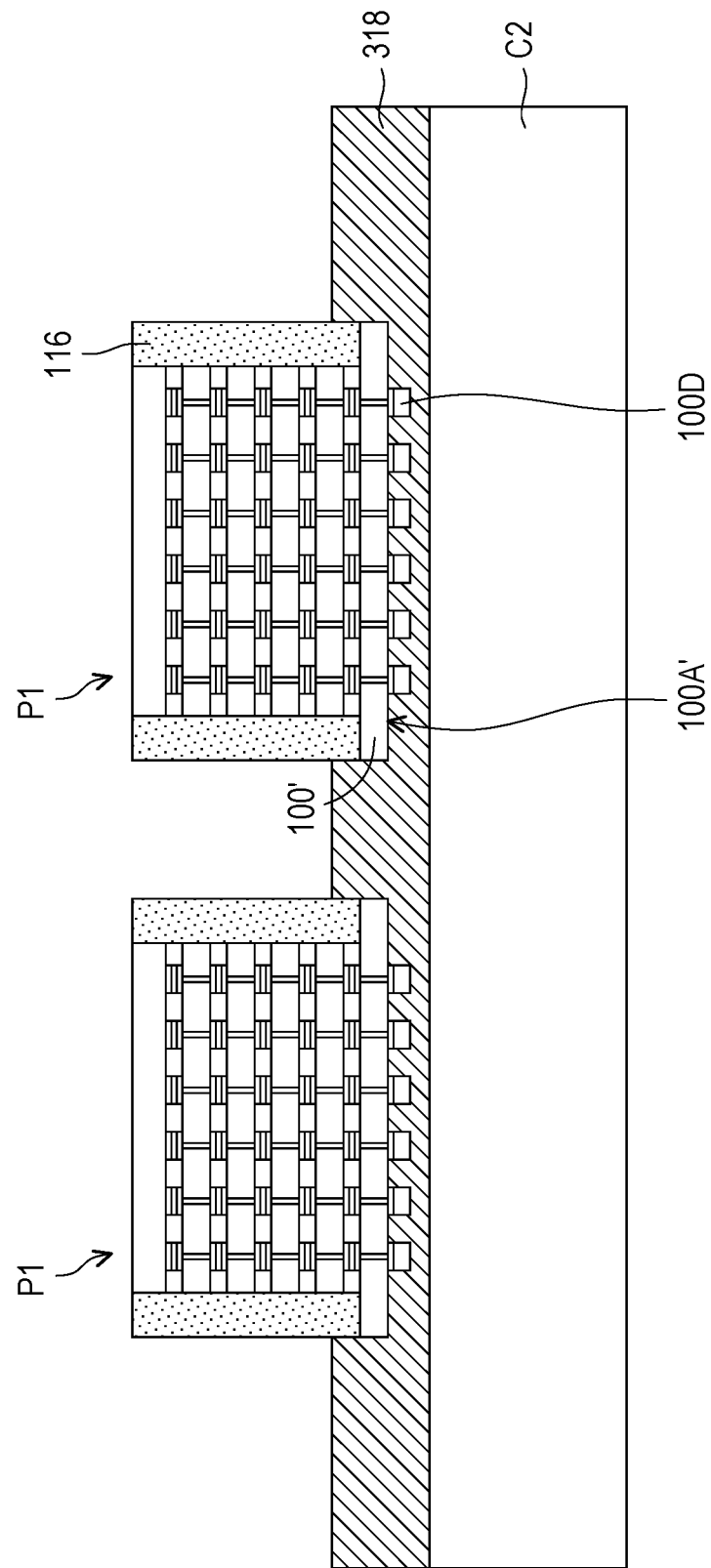
FIGS. 16 through 19 schematically illustrate cross-sectional views of various processing steps during fabrication of HBM devices in accordance with some alternative embodiments.
Figure 17:
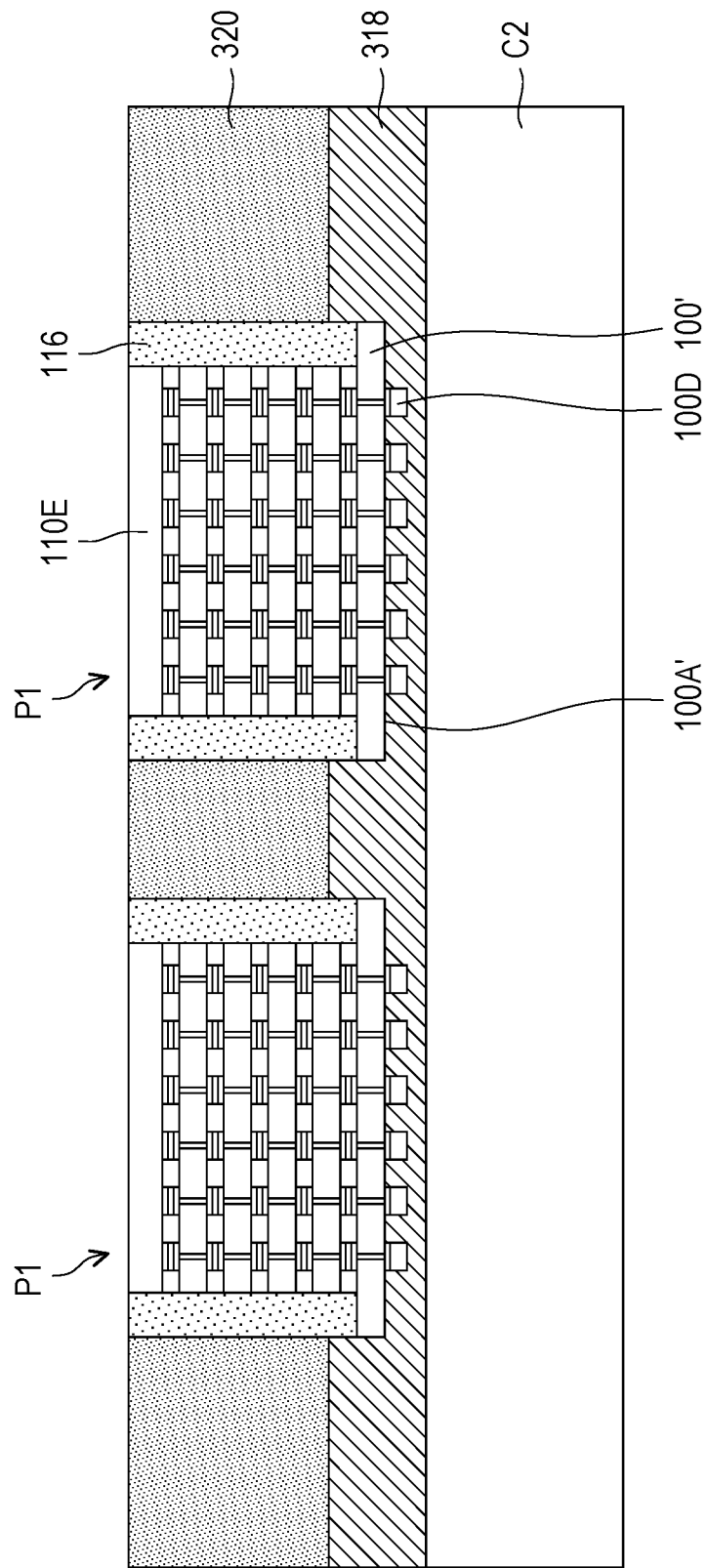
Figure 18:
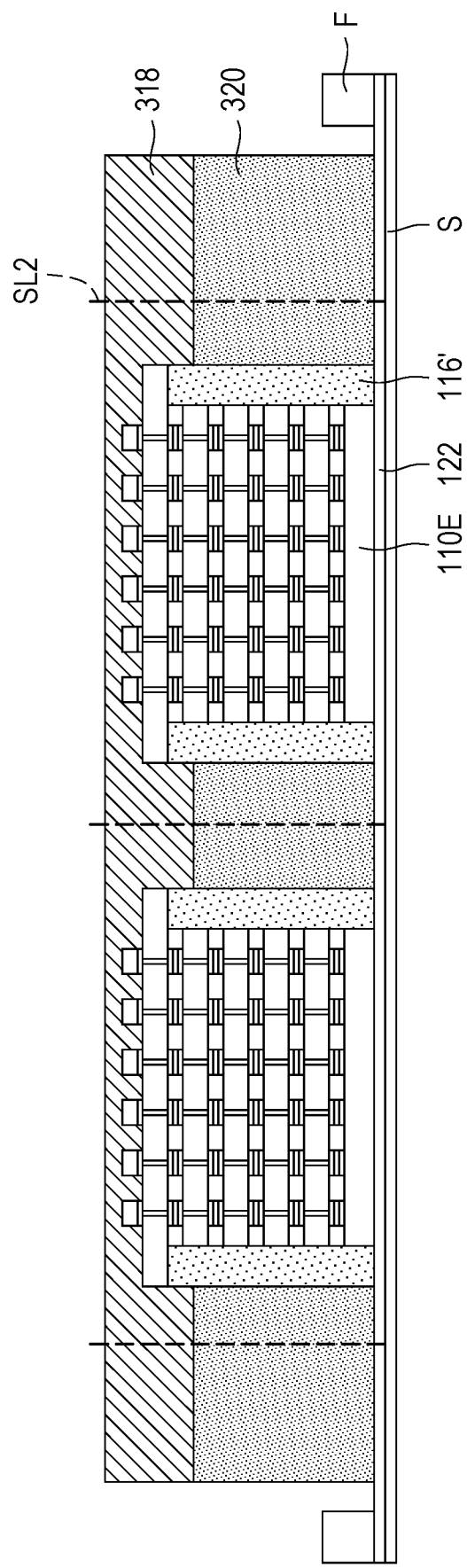
Figure 19:
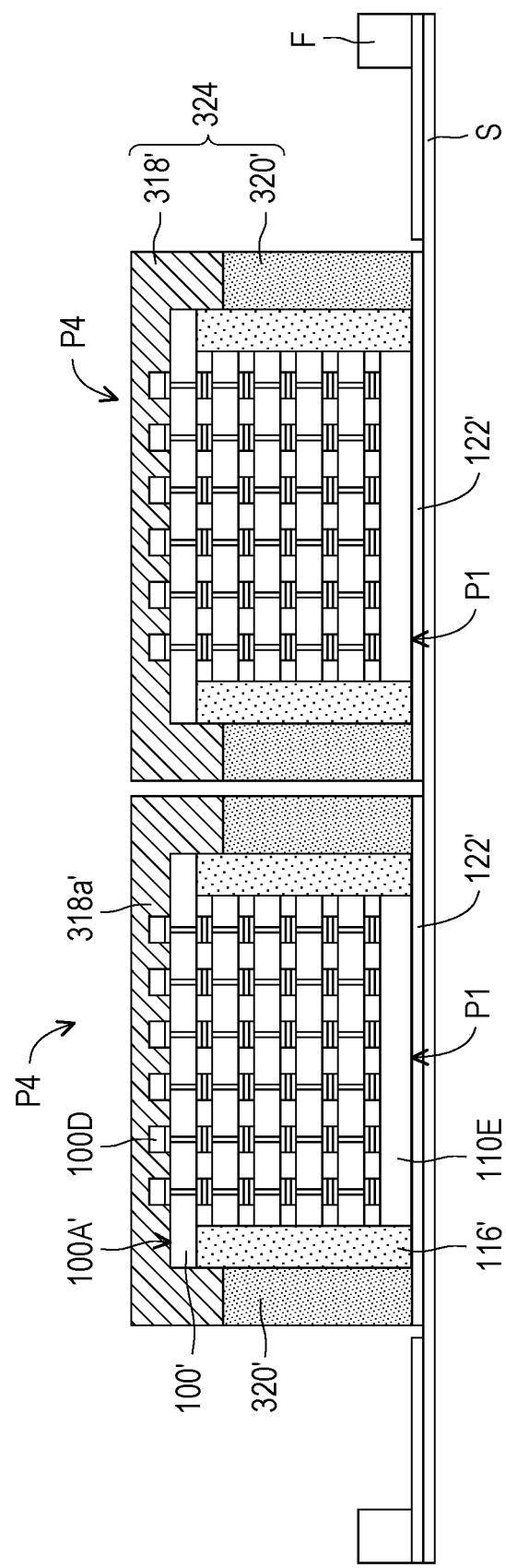

Referring to FIGS. 8 through 11 and FIGS. 16 through 19, the processing steps illustrated in FIGS. 16 through 19 are similar with the processing steps illustrated in FIGS. 8 through 11 except that the profile of the first buffer material layer 318 and the configuration of the buffer cap 324. As illustrated in FIGS. 16 through 18, the first buffer material layer 318 is covered by the second buffer material layer 320, the first buffer material layer 318 includes a flat surface in contact with the second buffer layer 320. As illustrated in FIG. 19, in the singulated package structure P4, the buffer cap 324 includes a first buffer layer 318' and a second buffer layer 320', wherein the first buffer layer 318' includes a flat surface in contact with the second buffer layer 320'.

FIGS. 20 through 26 schematically illustrate cross-sectional views of various processing steps during fabrication of package structures in accordance with some embodiments.

Figure 20:
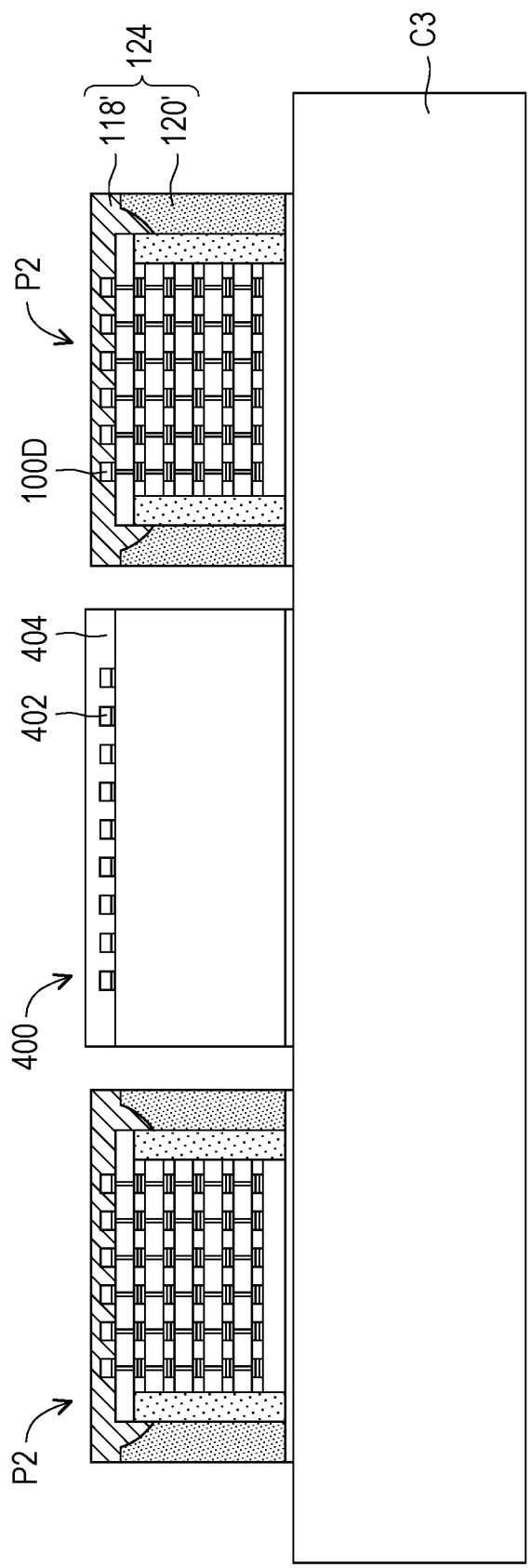
FIGS. 20 through 26 schematically illustrate cross-sectional views of various processing steps during fabrication of package structures in accordance with some embodiments.

Referring to FIG. 20, a carrier C3 is provided. At least one semiconductor die 400 and multiple package structures P2 are picked-up and placed on the carrier C3. The semiconductor die 400 and multiple package structures P2 are picked-up and placed on the carrier C3 by a pick-up and placement tool. During the pick-up and placement process of the package structures P2, the conductive terminals 100D are protected by the protection layer 318' from being in contact with the pick-up and placement tool directly. Accordingly, reliability of package structures P2 is ensured.

The semiconductor die 400 may include a logic die, a CPU, a GPU, an xPU, a MEMS die, an SoC die, or the like. The package structures P2 may include memory devices (e.g., HBM cubes). In some embodiments, the package structures P2 are mounted over the carrier C3 prior to mounting of the at least one semiconductor die 400. In some other embodiments, the at least one semiconductor die 400 are mounted over the carrier C3 prior to mounting of the package structures P2. The semiconductor die 400 includes a semiconductor substrate (not individually shown), one or more active and/or passive devices (not individually shown) on the semiconductor substrate, an interconnect structure (not individually shown) over the one or more active and/or passive devices and the semiconductor substrate, conductive terminals 402 disposed over the interconnect structure and a protection layer 404 disposed over the interconnect structure. The conductive terminals 402 are covered by the protection layer 404. The protection layer 404 may have flat top surface. In some other embodiments, the protection layer 404 may have curved top surface. The profile of the protection layer 404 is not limited in the present disclosure.

During the pick-up and placement process of the semiconductor die 400, the conductive terminals 402 are protected by the protection layer 404 from being in contact with the pick-up and placement tool directly. Accordingly, reliability of semiconductor die 400 is ensured. In some other embodiments, the protection layer 404 of the semiconductor die 400 may be omitted. In other words, the conductive terminals 402 of the semiconductor die 400 may not covered by a protection layer when the semiconductor die 400 is picked-up and placed on the carrier C3.

In some embodiments, the semiconductor substrate may be formed of silicon, although it may also be formed of other group III, group IV, and/or group V elements, such as germanium, gallium, arsenic, and combinations thereof. The semiconductor substrate may also be in the form of silicon-on-insulator (SOI). The SOI substrate may include a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In some embodiments, the semiconductor wafer 100 further includes one or more active and/or passive devices (not individually shown) formed on the substrate. The one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like.

The interconnect structure may include stacked dielectric layers (such an inter-layer dielectric (ILD)/inter-metal dielectric layers (IMDs)) and interconnect wirings (such as conductive lines and vias) between in the stacked dielectric layers. The stacked dielectric layers may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, the interconnect wirings may be formed in the stacked dielectric layers using, for example, a damascene process, a dual damascene process, a combination thereof, or the like. In some embodiments, the interconnect wirings include copper wirings, silver wirings, gold wirings, tungsten wirings, tantalum wirings, aluminum wirings, a combination thereof, or the like. In some embodiments, the interconnect wirings provide electrical connections between the one or more active and/or passive devices formed on the substrate.

In some embodiments, the conductive 402 of the semiconductor die 400 include conductive pillars and solder material over the conductive pillars. The conductive pillars may include conductive material such as copper, tungsten, aluminum, silver, gold, a combination thereof, or the like. The solder material may include lead-based solders such as PbSn compositions, lead-free solders including InSb, tin, silver, and copper ("SAC") compositions, and other eutectic materials that have a common melting point and form conductive solder connections in electrical applications. For lead-free solders, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

In some embodiments, the protection layer 404 is formed of polymer such as polybenzoxazole (PBO), polyimide, benzocyclobutene (BCB), or the like. In some other embodiments, the protection layer 404 is formed of nitride such as silicon nitride, oxide such as silicon oxide, PhosphoSilicate Glass (PSG), BoroSilicate Glass (BSG), Boron-doped PhosphoSilicate Glass (BPSG), or the like.

Figure 21:
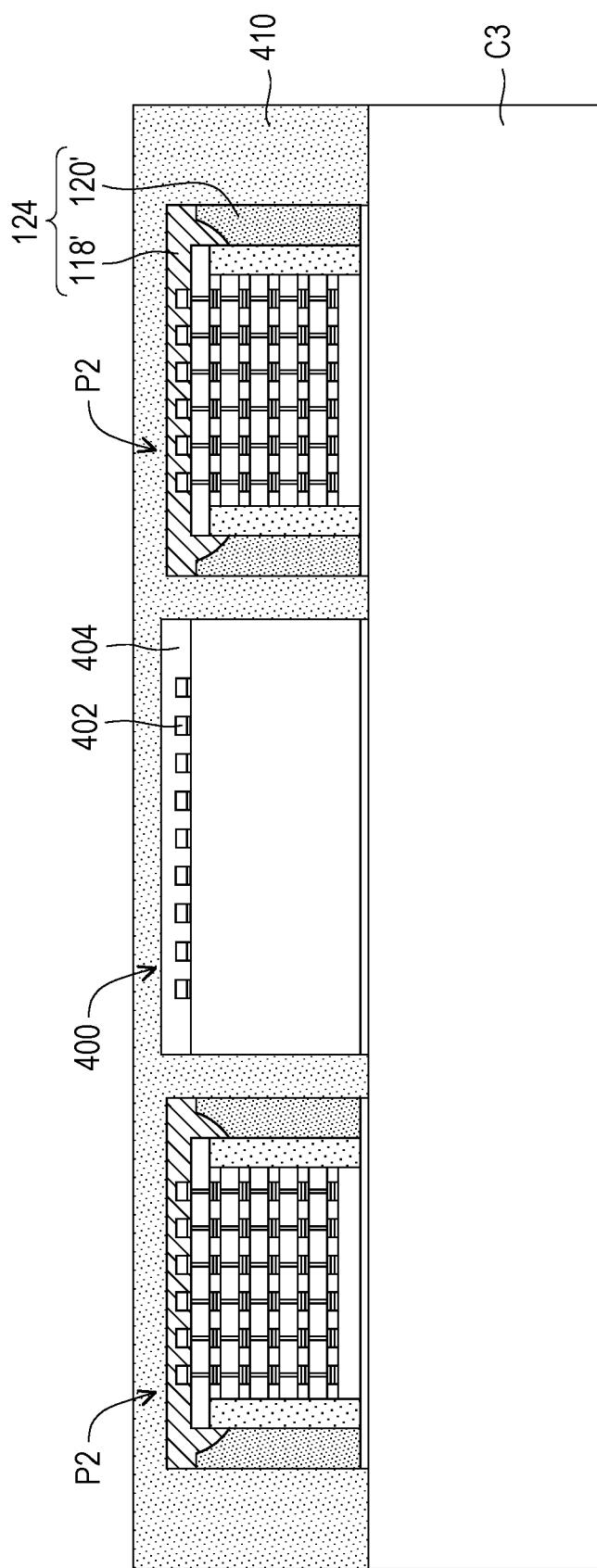
Figure 22:
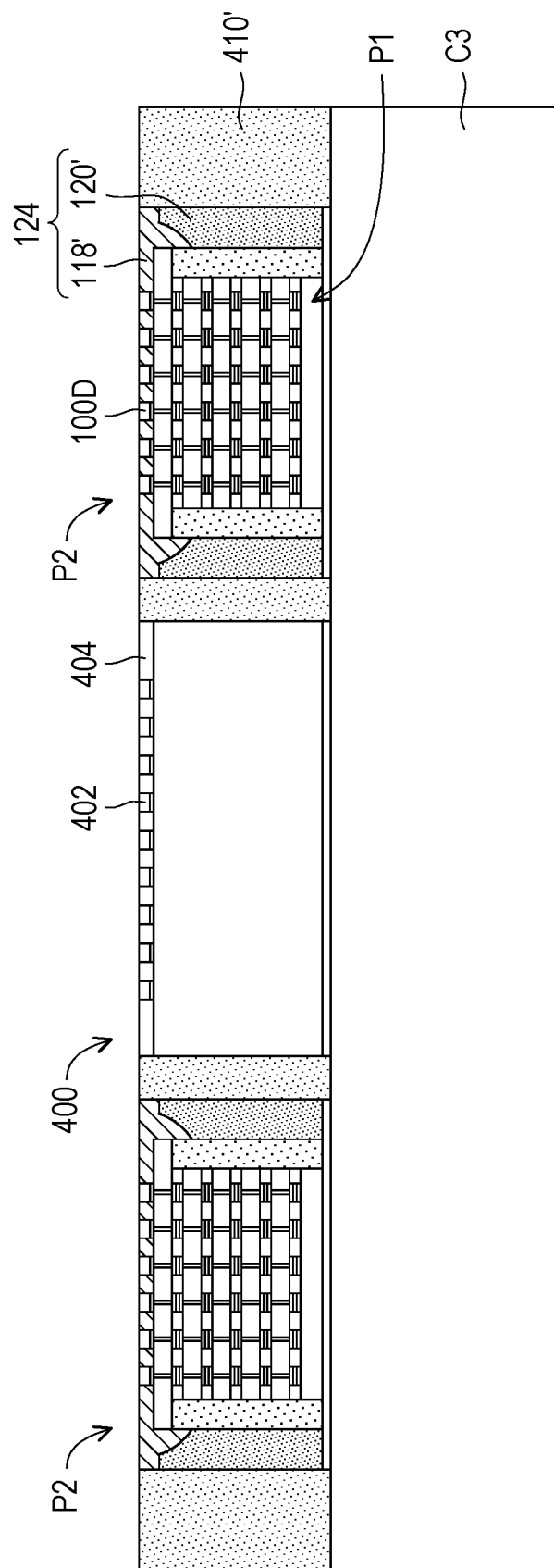

Referring to FIG. 21 and FIG. 22, an insulating encapsulation material 410 is formed over the carrier C3 to cover the package structures P2 and the semiconductor die 400. The insulating encapsulation material 410 may be a molding compound (e.g., epoxy or other suitable resin) formed through an over-molding process. The insulating encapsulation material 410 fills the gaps between neighboring package structures P2 and the semiconductor die 400. Then, the insulating encapsulation material 410, the protection layer 404 of the semiconductor die 400 and the first buffer layers 118' in the package structures P2 are partially removed until the conductive terminals 402 and the conductive terminals 100D are revealed. A planarization process such as a Chemical Mechanical Polish (CMP) process and/or a mechanical grinding process is performed to partially remove the insulating encapsulation material 410, the protection layer 404 and the first buffer layers 118' until the conductive terminals 402 and the conductive terminals 100D are exposed. After the insulating encapsulation material 410, the protection layer 404 of the semiconductor die 400 and the first buffer layers 118' in the package structures P2 are partially removed, the conductive terminals 100D penetrate through the first buffer layers 118' and the conductive terminals 402 penetrate through the protection layer 404. After the insulating encapsulation material 410 is thinned, an insulating encapsulation 410' is formed to laterally encapsulate the semiconductor die 400 and the package structures P2. The electronic devices P1 in the package structures P2 are spaced apart from the insulating encapsulation 410' by the buffer cap 124. The buffer cap 124 may serve as a stress buffer formed between the electronic devices P1 and the insulating encapsulation 410' to minimize de-lamination issue occurring at the interface between the electronic devices P1 and the insulating encapsulation 410'. The material of the first buffer layers 118' is different from that of the second buffer layers 120'. The material of the first buffer layers 118' may be or include polymer, for example, epoxy or polyimide. The material of the second buffer layers 120' may be or include polymer, for example, epoxy or polyimide. The elastic modulus at room temperature of the first buffer layers 118' may be smaller than that of the second buffer layers 120'. In some embodiments, the elastic modulus of the first buffer layers 118' at room temperature ranges from about 5 GPa to about 15 GPa, and the elastic modulus of the second buffer layers 120' at room temperature ranges from about 10 GPa to about 20 GPa. The elastic modulus of the first buffer layers 118' at 250 Celsius degrees may be smaller than that of the second buffer layers 120'. The elastic modulus of the first buffer layers 118' at 250 Celsius degrees may range from about 0.05 GPa to about 0.2 GPa, and the elastic modulus of the second buffer layers 120' at Celsius degrees 250 may range from about 0.7 GPa to about 1.5 GPa. The coefficient of thermal expansion (CTE) of the first buffer layers 118' may be greater than that of the second buffer layers 120'. The CTE of the first buffer layers 118' may range from about 25 ppt/k to about 200 ppt/k, and the CTE of the second buffer layers 120' may range from about 5 ppt/k to about 40 ppt/k.

As illustrated in FIG. 22, due to the planarization process, the top surface of the protection layer 404, top surfaces of the first buffer layers 118', the top surfaces of the conductive terminals 100D, the top surface of the conductive terminals 402 are substantially level or coplanar with the top surface of the insulating encapsulation 410'.

Figure 23:
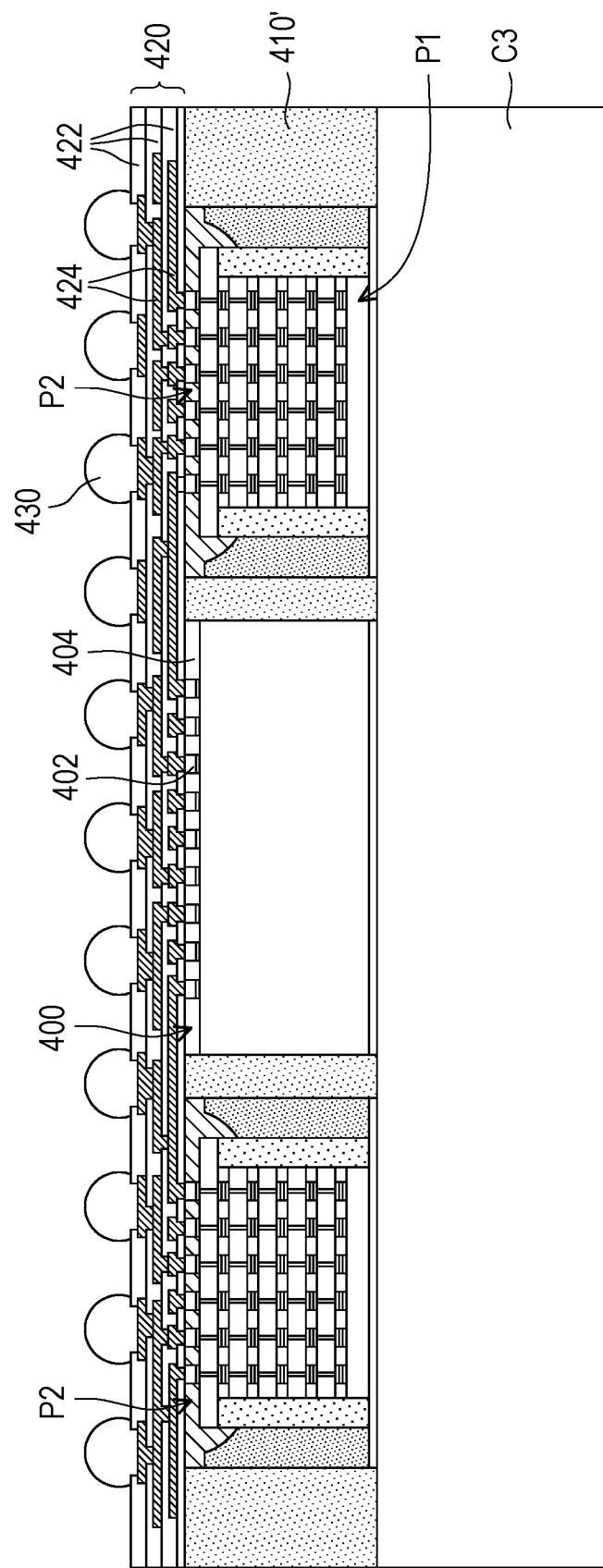

Referring to FIG. 23, a redistribution circuit structure 420 is formed to cover the conductive terminals 402, the conductive terminals 100D, the buffer caps 124 of the package structures P2, the protection layer 404 of the semiconductor die 400 and the insulating encapsulation 410'. The redistribution circuit structure 420 is electrically connected to the conductive terminals 402 of the semiconductor die 400 and the conductive terminals 400D of the package structures P2.

The redistribution circuit structure 420 may include stacked dielectric layers 422 and redistribution wirings 424 sandwiched between the stacked dielectric layers 422. In some embodiments, the stacked dielectric layers 422 are formed of polymer, which may also be photo-sensitive material such as polybenzoxazole (PBO), polyimide, benzocyclobutene (BCB), or the like, which may be easily patterned using a photolithography process. In some other embodiments, the stacked dielectric layers 422 are formed of nitride such as silicon nitride, oxide such as silicon oxide, PhosphoSilicate Glass (PSG), BoroSilicate Glass (BSG), Boron-doped PhosphoSilicate Glass (BPSG), or the like. The material of the redistribution wirings 424 may include copper, aluminum, alloy thereof, or the like. The formation of the redistribution wirings 424 may include forming a seed layer (not shown) over the dielectric layers 422, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 424. In accordance with some embodiments, the seed layer includes a titanium layer and a copper layer over the titanium layer. The seed layer may be formed using, for example, Physical Vapor Deposition (PVD). The plating process may be performed using, for example, electroless plating.

After forming the redistribution circuit structure 420, conductive bumps 430 are formed on the redistribution circuit structure 420. In some embodiments, the conductive bumps 430 include controlled collapse chip connection (C4) bumps or other metallic C4 bumps which are landed on and electrically connected to the redistribution circuit structure 420. Other types of conductive bumps may be formed on the redistribution circuit structure 420. After forming the redistribution circuit structure 420 and the conductive bumps 430, a wafer level fan-out package structure is formed over the carrier C3.

Figure 24:
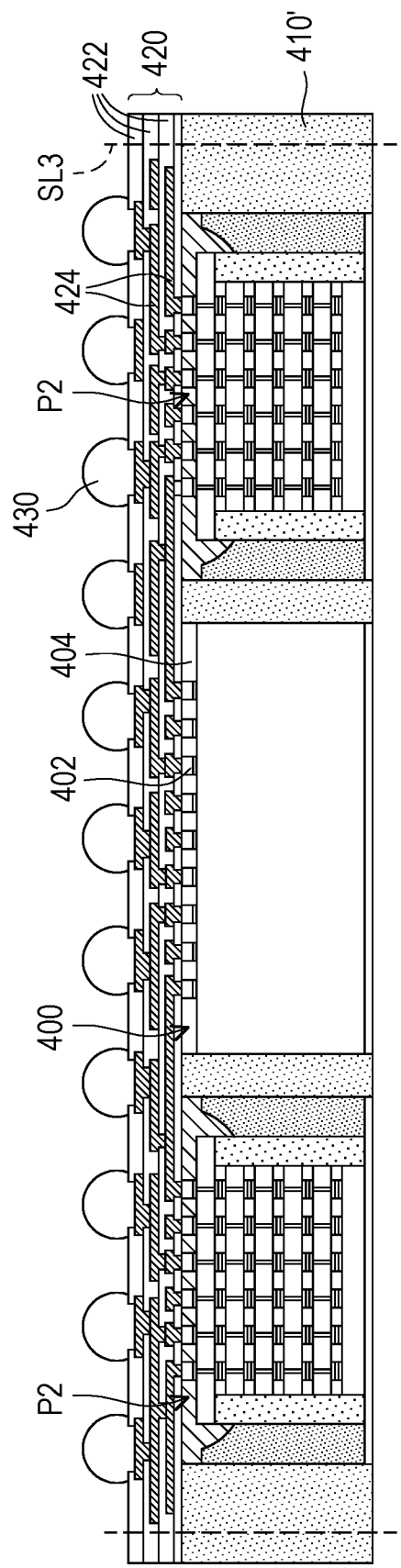
Figure 25:
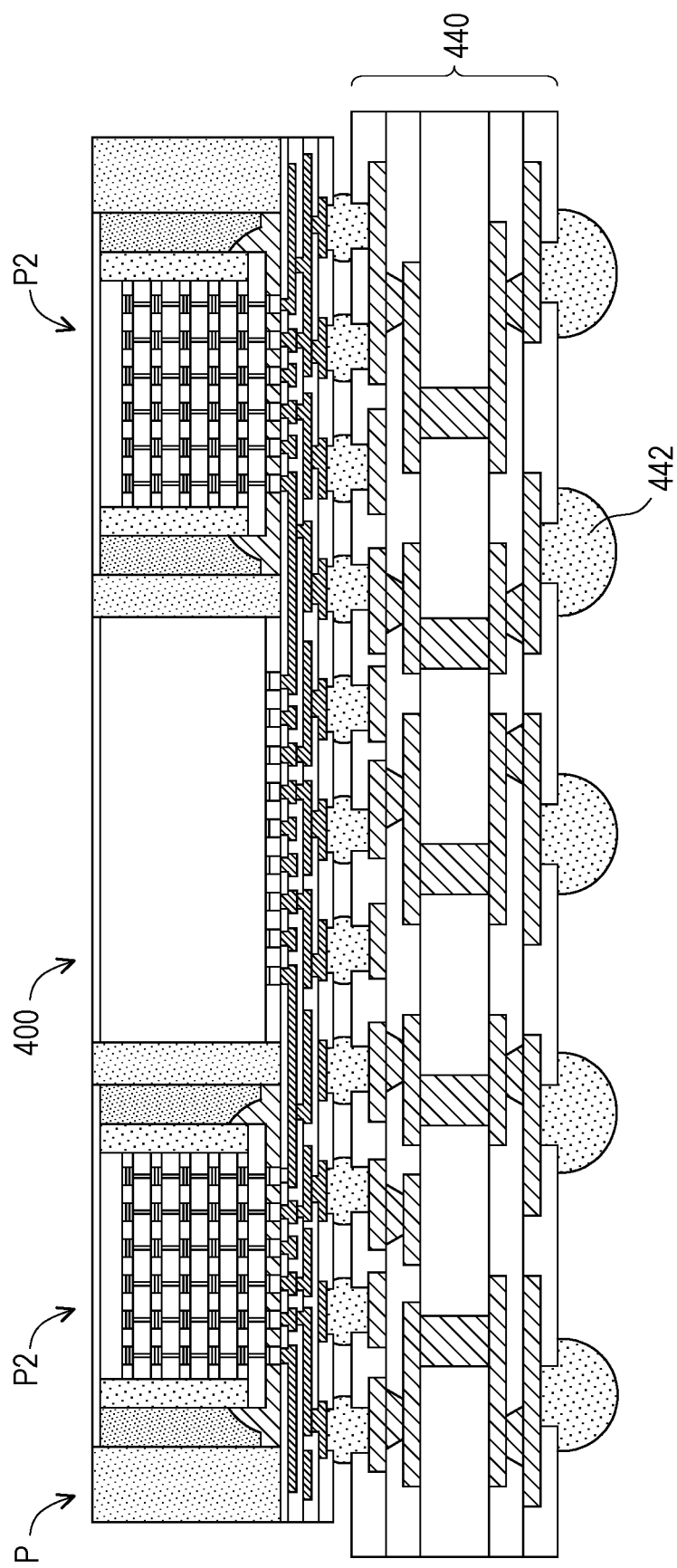

Referring to FIGS. 23 through 25, the wafer level fan-out package structure is de-bonded from the carrier C3. Then, a singulation process (e.g., a sawing process) is performed along the scribe lines SL3 to cut the redistribution circuit structure 420 and the insulating encapsulation 410' such that singulated fan-out package structures P (FIG. 25) are obtained. The redistribution circuit structure 420 and the insulating encapsulation 410' may be cut, for example, by mechanical sawing, laser ablation, etching, a combination thereof, or the like.

As illustrated in FIG. 25, a package substrate 440 including conductive terminals 442 formed thereon is provided. The singulated fan-out package structure P is picked-up and placed on a package substrate 440 such that the singulated fan-out package structure P is electrically connected to the package substrate 440 through the conductive bumps 430. The conductive bumps 430 and the fan-out package structure P are located at opposite sides of the package substrate 440.

Figure 26:
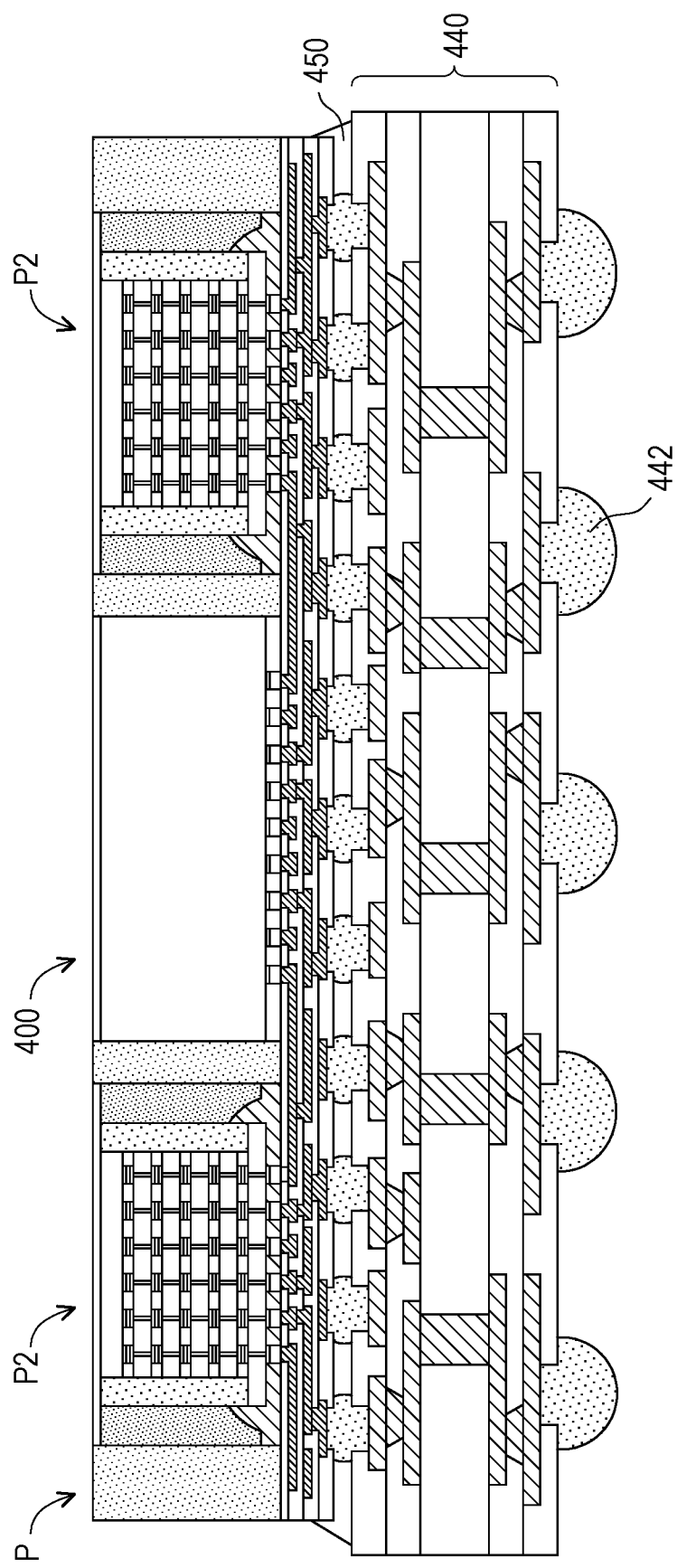

Referring to FIG. 25 and FIG. 26, an underfill 450 is formed over the package substrate 440 such that the gap between the singulated fan-out package structure P and the package substrate 440 is filled with the underfill 450. The underfill 450 may partially covers sidewalls of the singulated fan-out package structure P. The underfill 450 may be or include polymer, for example, epoxy. The underfill 450 may be made to flow between the singulated fan-out package structure P and the package substrate 440, using capillary effect. In an embodiment wherein the underfill 450 is formed from a material such as a polymer epoxy, the underfill 450 is then cured to harden the polymer. The cured underfill 450 laterally encapsulates the conductive bumps 430, as well as supports the singulated fan-out package structure P on the package substrate 440.

In some other embodiments, the package structure P2 in the fan-out package structures P may be replaced by the package structures P3 (FIG. 15) or the package structures P4 (FIG. 19) or the combination thereof.

Figure 27:
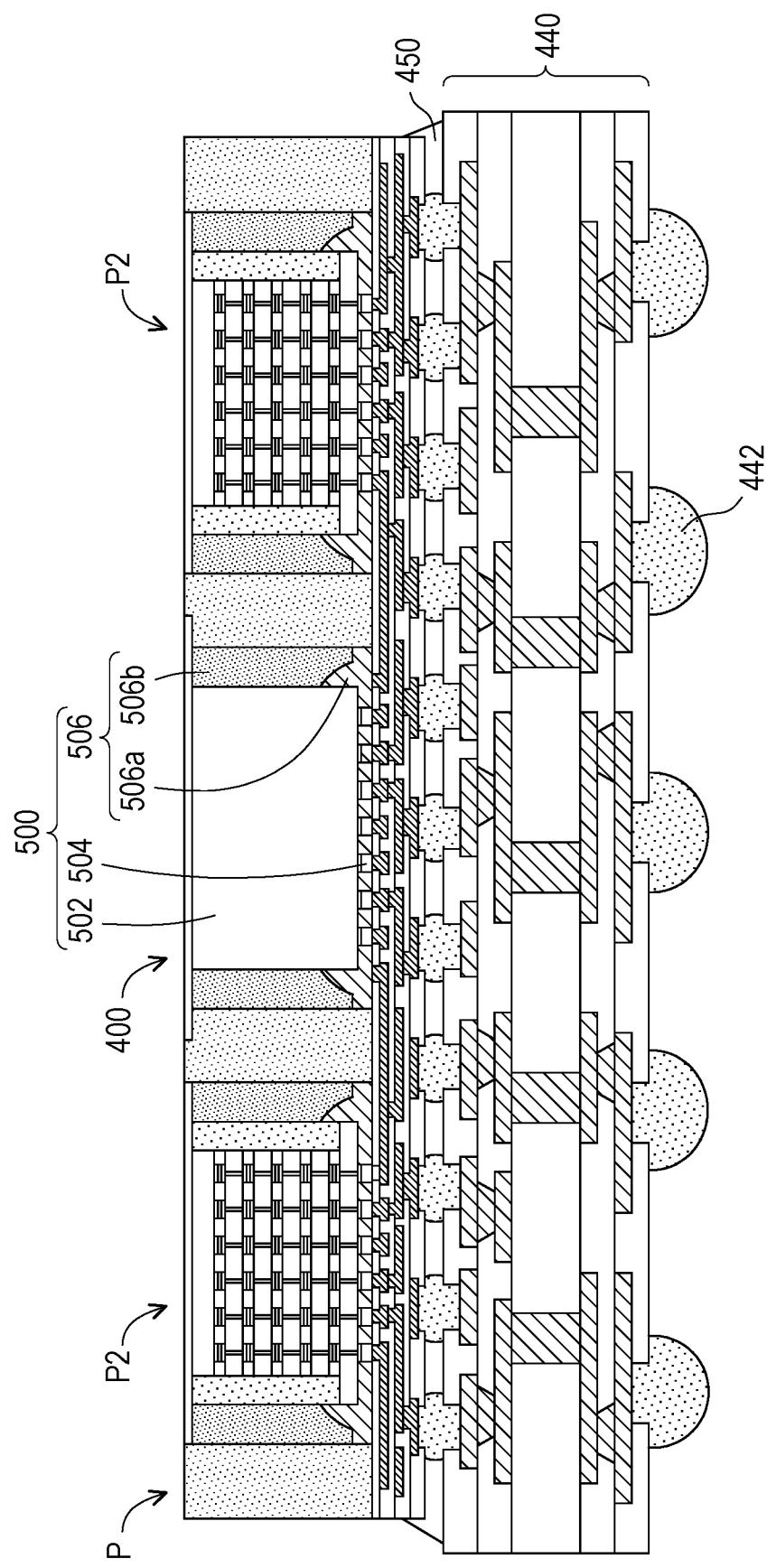
FIGS. 27 through 29 are cross-sectional views of various package structures in accordance with some alternative embodiments.
Figure 28:
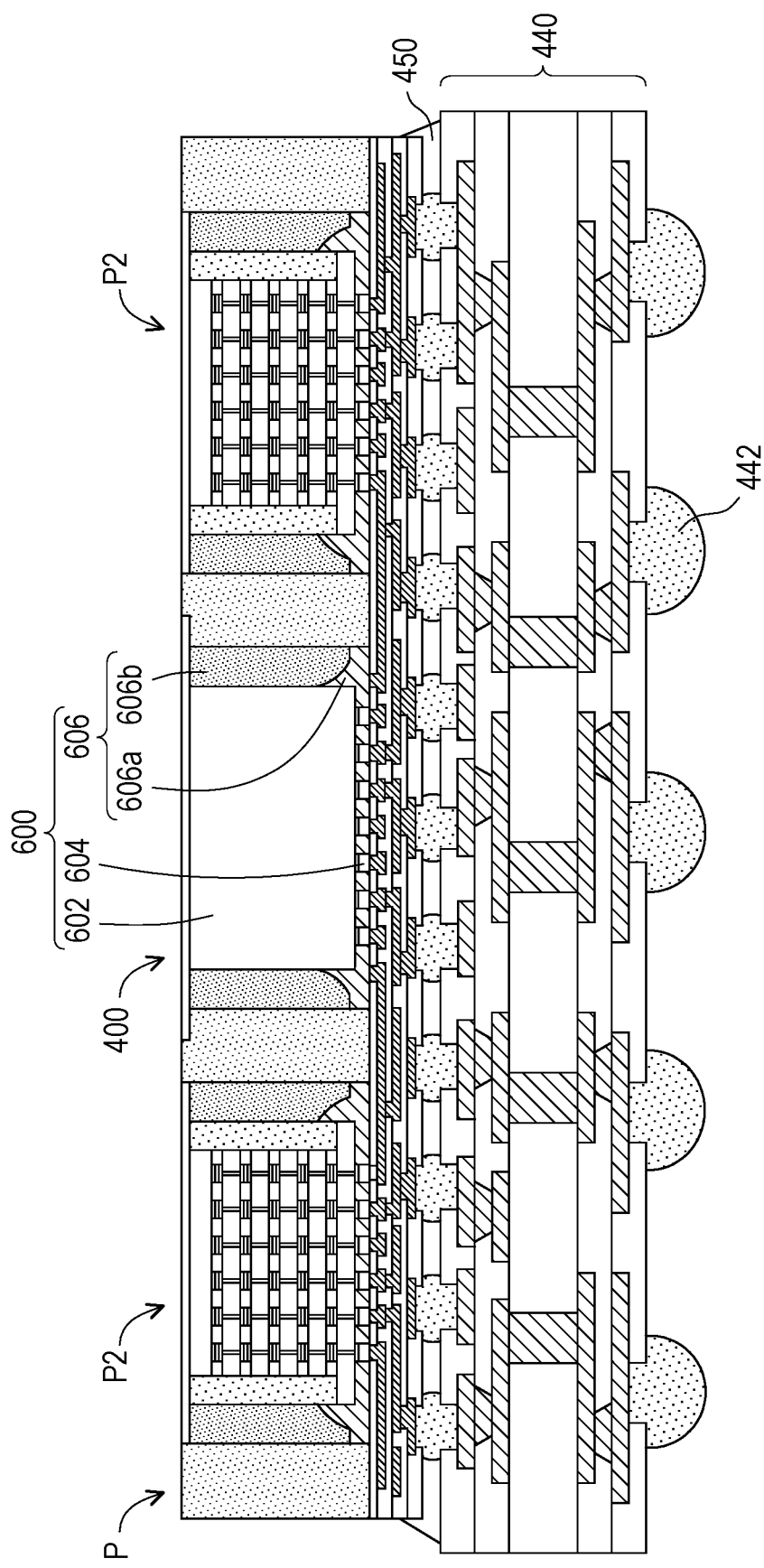
Figure 29:
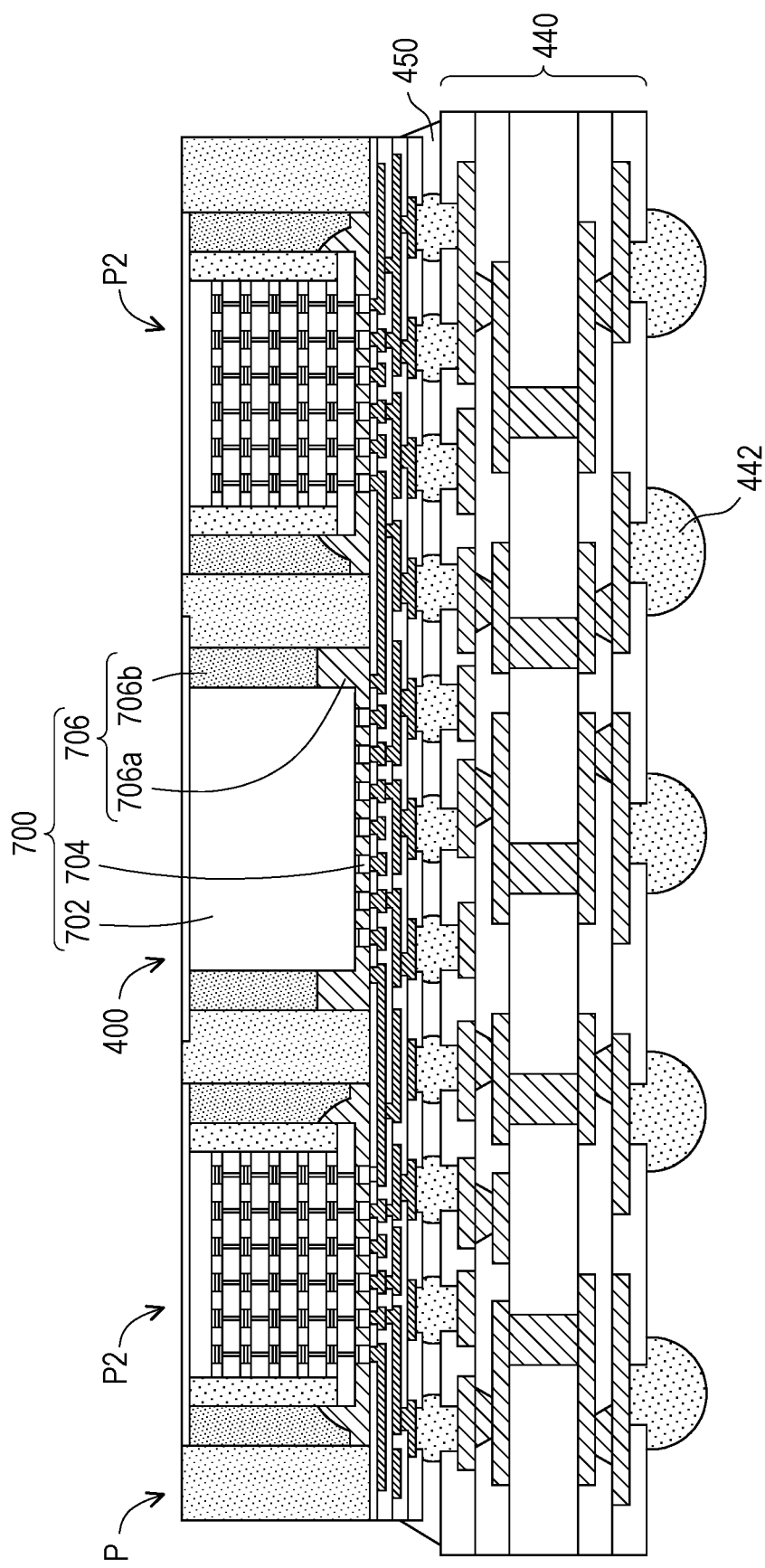

FIGS. 27 through 29 are cross-sectional views of various package structures in accordance with some alternative embodiments.

Referring to FIG. 26 and FIG. 27, the package structure illustrated in FIG. 27 is similar with that illustrated in FIG. 26 except that the semiconductor die 400 illustrated in FIG. 26 is replaced by an electronic device 500. As illustrated in FIG. 27, the electronic device 500 includes a semiconductor die 502 having conductive terminals 504 formed thereon and a buffer cap 506 including a first buffer layer 506a and a second buffer layer 506b. The first buffer layer 506a includes a ring-shaped protruding portion covering sidewalls of the semiconductor die 502, and the ring-shaped protruding portion includes a rounded and convex surface in contact with the second buffer layer 506b. The fabrication process of the electronic device 500 is similar with the fabrication process of the package structures P2 which are illustrated in FIGS. 8 through 11. In some other embodiments, the package structures P2 may be replaced by the package structures P3 (FIG. 15) or the package structures P4 (FIG. 19) or the combination thereof.

Referring to FIG. 27 and FIG. 28, the package structure illustrated in FIG. 28 is similar with that illustrated in FIG. 27 except that the electronic device 500 illustrated in FIG. 27 is replaced by an electronic device 600. As illustrated in FIG. 28, the electronic device 600 includes a semiconductor die 602 having conductive terminals 604 formed thereon and a buffer cap 606 including a first buffer layer 606a and a second buffer layer 606b. The first buffer layer 606a includes a ring-shaped protruding portion covering sidewalls of the semiconductor die 602, and the ring-shaped protruding portion includes a rounded and concave surface in contact with the second buffer layer 606b. The fabrication process of the electronic device 600 is similar with the fabrication process of the package structures P3 which are illustrated in FIGS. 12 through 15. In some other embodiments, the package structures P2 may be replaced by the package structures P3 (FIG. 15) or the package structures P4 (FIG. 19) or the combination thereof.

Referring to FIG. 27 and FIG. 29, the package structure illustrated in FIG. 29 is similar with that illustrated in FIG. 27 except that the electronic device 500 illustrated in FIG. 27 is replaced by an electronic device 700. As illustrated in FIG. 29, the electronic device 700 includes a semiconductor die 702 having conductive terminals 704 formed thereon and a buffer cap 706 including a first buffer layer 706a and a second buffer layer 706b. The first buffer layer 706a includes a ring-shaped protruding portion covering sidewalls of the semiconductor die 702, and the ring-shaped protruding portion includes a flat surface in contact with the second buffer layer 706b. The fabrication process of the electronic device 700 is similar with the fabrication process of the package structures P4 which are illustrated in FIGS. 16 through 19. In some other embodiments, the package structures P2 may be replaced by the package structures P3 (FIG. 15) or the package structures P4 (FIG. 19) or the combination thereof.

In the above-mentioned embodiments, the buffer caps 124, 224, 324 formed in the package structures P2, P3 and P4 may not only improve the reliability of the package structures P2, P3 and P4, but also enlarge the process window of the package process of the package structures P2, P3 and P4.

In accordance with an embodiment, a memory device including a base semiconductor die, conductive terminals, memory dies, an insulating encapsulation and a buffer cap is provided. The conductive terminals are disposed on a first surface of the base semiconductor die. The memory dies are stacked over a second surface of the base semiconductor die, and the second surface of the base semiconductor die is opposite to the first surface of the base semiconductor die. The insulating encapsulation is disposed on the second surface of the base semiconductor die and laterally encapsulates the memory dies. The buffer cap covers the first surface of the base semiconductor die, sidewalls of the base semiconductor die and sidewalls of the insulating encapsulation. In some embodiments, a width of the base semiconductor die is greater than a width of the memory dies. In some embodiments, the sidewalls of the insulating encapsulation substantially align with sidewalls of the base semiconductor die. In some embodiments, the conductive terminals penetrate through the buffer cap. In some embodiments, the buffer cap includes a first buffer layer and a second buffer layer, wherein the first buffer layer covers the first surface of the base semiconductor die, the sidewalls of the base semiconductor die and upper portions of the sidewalls of the insulating encapsulation, the second buffer layer covers bottom portions of the sidewalls of the insulating encapsulation, and sidewalls of the first buffer layer substantially align with sidewalls of the second buffer layer. In some embodiments, the first buffer layer includes a base portion and a ring-shaped protruding portion, wherein the base portion covers the first surface of the base semiconductor die and laterally encapsulates the conductive terminals, and the ring-shaped protruding portion extends from the base portion to cover the sidewalls of the base semiconductor die and the upper portions of the sidewalls of the insulating encapsulation. In some embodiments, the ring-shaped protruding portion includes a convex surface or a concave surface in contact with the second buffer layer. In some embodiments, the ring-shaped protruding portion includes a flat surface in contact with the second buffer layer. In some embodiments, the memory device further includes an adhesion layer in contact with the memory dies, the insulating encapsulation and the buffer cap.

In accordance with another embodiment, a package structure including an electronic device and a buffer cap is provided. The electronic device includes a top surface, and the electronic device includes conductive terminals distributed on the top surface of the electronic device. The buffer cap covers the top surface and sidewalls of the electronic device. The buffer cap includes a first buffer layer and a second buffer layer. The first buffer layer covers the top surface of the electronic device and upper portions of the sidewalls of the electronic device, and the conductive terminals penetrate through the first buffer layer. The second buffer layer covers bottom portions of the sidewalls of the electronic device, and sidewalls of the first buffer layer substantially align with sidewalls of the second buffer layer. The first insulating encapsulation laterally encapsulates the electronic device and the buffer cap. In some embodiments, the electronic device includes a semiconductor die having the conductive terminals. In some embodiments, the electronic device includes a memory device, and the memory device includes a base semiconductor die, memory dies and a second insulating encapsulation, the conductive terminals are disposed on a first surface of the base semiconductor die, the memory dies are stacked over a second surface of the base semiconductor die, the second surface is opposite to the first surface, the second insulating encapsulation is disposed on the second surface of the base semiconductor die and laterally encapsulates the memory dies, the buffer cap covers the first surface of the base semiconductor die, sidewalls of the base semiconductor die and sidewalls of the insulating encapsulation, wherein the first insulating encapsulation is spaced apart from the second insulating encapsulation by the buffer cap. In some embodiments, the first buffer layer includes a base portion and a ring-shaped protruding portion, wherein the base portion covers the first surface of the base semiconductor die and laterally encapsulating the conductive terminals, the ring-shaped protruding portion extends from the base portion to cover the sidewalls of the base semiconductor die and the upper portions of the sidewalls of the insulating encapsulation. In some embodiments, the ring-shaped protruding portion includes a rounded and convex surface or a rounded and concave surface in contact with the second buffer layer. In some embodiments, the ring-shaped protruding portion includes a flat surface in contact with the second buffer layer. In some embodiments, the package structure further includes an adhesion layer in contact with the electronic device and the second buffer layer of the buffer cap, wherein the adhesion layer is laterally encapsulated by the first insulating encapsulation. In some embodiments, the package structure further includes a redistribution circuit structure disposed on the buffer cap and the first insulating encapsulation and electrically connected to the conductive terminals of the electronic device.

In accordance with yet another embodiment, a method including following steps is provided. An electronic device having a top surface is provided, wherein the electronic device includes conductive terminals distributed on the top surface of the electronic device. The electronic device is embedded in a first buffer layer of a buffer cap such that the first buffer layer covers the top surface of the electronic device, the conductive terminals and upper portions of the sidewalls of the electronic device. A second buffer layer of the buffer cap is formed on the first buffer layer, wherein the second buffer layer covers bottom portions of the sidewalls of the electronic device, and sidewalls of the first buffer layer substantially align with sidewalls of the second buffer layer. An insulating encapsulation material is formed to cover the electronic device encapsulated by the first buffer layer and the second buffer layer. The insulating encapsulation material and the first buffer layer of the buffer cap are partially removed until the conductive terminals are revealed. A redistribution circuit structure is formed on the buffer cap and the insulating encapsulation material, wherein the redistribution circuit structure is electrically connected to the conductive terminals of the electronic device. In some embodiments, embedding the electronic device in the first buffer layer of the buffer cap and forming the second buffer layer of the buffer cap on the first buffer layer includes: forming a first buffer material layer over a first carrier; pressing the electronic device onto the first buffer material layer carried by the first carrier such that the electronic device is partially sunken into the first buffer material layer; curing the first buffer material layer; forming a second buffer material layer to cover the first buffer material layer and the electronic device; partially removing the second buffer material layer until the electronic device is revealed; and performing a sawing process to saw the first buffer material layer and the second buffer material layer such that the electronic device encapsulated by the first buffer layer and the second buffer layer is obtained. In some embodiments, the electronic device encapsulated by the first buffer layer and the second buffer layer are picked-up and placed on a second carrier, and the insulating encapsulation material is formed over the second carrier to cover the electronic device encapsulated by the first buffer layer and the second buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a first semiconductor die comprising conductive terminals;
    second semiconductor dies stacked over the first semiconductor die, the conductive terminals being spaced apart from the second semiconductor die by the first semiconductor die;
    an insulating encapsulation disposed on the first semiconductor die to laterally encapsulate the second semiconductor die, sidewalls of the insulating encapsulation being substantially aligned with sidewalls of the first semiconductor die; and
    a buffer cap encapsulating the conductive terminals, wherein the buffer cap covers the sidewalls of the first semiconductor die and the sidewalls of the insulating encapsulation, wherein a maximum height of the buffer cap substantially equals to a sum of a first height of the first semiconductor die, a second height of the second semiconductor dies, and a third height of the conductive terminals.

2. The structure of claim 1, wherein the first semiconductor die is wider than the second semiconductor dies.

3. The structure of claim 1, wherein the buffer cap comprises:
    a first buffer layer covering a first surface of the first semiconductor die, the sidewalls of the first semiconductor die and upper portions of the sidewalls of the insulating encapsulation; and
    a second buffer layer covering bottom portions of the sidewalls of the insulating encapsulation, wherein sidewalls of the first buffer layer substantially align with sidewalls of the second buffer layer.

4. The structure of claim 3, wherein the first buffer layer comprises:
    a base portion covering the first surface of the first semiconductor die and laterally encapsulating the conductive terminals; and
    a ring-shaped protruding portion extending from the base portion to cover the sidewalls of the first semiconductor die and the upper portions of the sidewalls of the insulating encapsulation.

5. The structure of claim 4, wherein the ring-shaped protruding portion comprises a convex surface or a concave surface in contact with the second buffer layer.

6. The structure of claim 4, wherein the ring-shaped protruding portion comprises a flat surface in contact with the second buffer layer.

7. The structure of claim 1, wherein the buffer cap is spaced apart from the second semiconductor dies by the first semiconductor die and the insulating encapsulation.

8. The structure of claim 1, wherein the conductive terminals penetrate through the buffer cap.

9. The structure of claim 1 further comprising:
    an adhesion layer in contact with the second semiconductor dies, the insulating encapsulation and the buffer cap.

10. A package structure, comprising:
    an electronic device comprising conductive terminals;
    a buffer cap covering sidewalls of the electronic device, the buffer cap extending over a surface of the electronic device on which the conductive terminals are distributed to laterally encapsulate the conductive terminals;
    a first insulating encapsulation laterally encapsulating the electronic device and the buffer cap; and
    an adhesion layer in contact with the electronic device and the buffer cap.

11. The package structure of claim 10, wherein the electronic device comprises a semiconductor die having the conductive terminals.

12. The package structure of claim 10, wherein the electronic device comprises a memory device, and the memory device comprises:
    a base semiconductor die, the conductive terminals being disposed on a first surface of the base semiconductor die;
    memory dies stacked over a second surface of the base semiconductor die, the second surface being opposite to the first surface; and
    a second insulating encapsulation disposed on the second surface of the base semiconductor die and laterally encapsulating the memory dies, the buffer cap covering the first surface of the base semiconductor die, sidewalls of the base semiconductor die and sidewalls of the insulating encapsulation, wherein the first insulating encapsulation is spaced apart from the second insulating encapsulation by the buffer cap.

13. The package structure of claim 12, wherein the buffer cap comprises:
    a first buffer layer in contact with the surface of the electronic device and upper portions of the sidewalls of the electronic device, wherein the first buffer layer comprises: a base portion covering the first surface of the base semiconductor die and laterally encapsulating the conductive terminals; and a ring-shaped protruding portion extending from the base portion to cover the sidewalls of the base semiconductor die and the upper portions of the sidewalls of the insulating encapsulation; and
    a second buffer layer in contact with bottom portions of the sidewalls of the electronic device, wherein sidewalls of the first buffer layer substantially align with sidewalls of the second buffer layer.

14. The package structure of claim 13, wherein the ring-shaped protruding portion comprises a rounded and convex surface or a rounded and concave surface in contact with the second buffer layer.

15. The package structure of claim 13, wherein the ring-shaped protruding portion comprises a flat surface in contact with the second buffer layer.

16. The package structure of claim 13, wherein the adhesion layer is
in contact with the electronic device and the second buffer layer of the buffer cap, and the adhesion layer is laterally encapsulated by the first insulating encapsulation.

17. The package structure of claim 10 further comprising:
a redistribution circuit structure disposed on the buffer cap and the first insulating encapsulation and electrically connected to the conductive terminals of the electronic device.

18. A structure, comprising:
a first semiconductor die comprising conductive terminals;
second semiconductor dies stacked over the first semiconductor die, wherein the conductive terminals are spaced apart from the second semiconductor die by the first semiconductor die, and the first semiconductor die is wider than the second semiconductor dies;
an insulating encapsulation disposed on the first semiconductor die to laterally encapsulate the second semiconductor die, sidewalls of the insulating encapsulation being substantially aligned with sidewalls of the first semiconductor die; and
a buffer cap laterally encapsulating the first semiconductor die and the insulating encapsulation, wherein the buffer cap is wider than the first semiconductor die, wherein the buffer cap comprises:
a first buffer layer covering a first surface of the first semiconductor die, the sidewalls of the first semiconductor die and upper portions of the sidewalls of the insulating encapsulation; and
a second buffer layer covering bottom portions of the sidewalls of the insulating encapsulation, wherein sidewalls of the first buffer layer substantially align with sidewalls of the second buffer layer.

19. The structure of claim 18, wherein the conductive terminals penetrate through the buffer cap.

20. The structure of claim 18, wherein a maximum height of the buffer cap substantially equals to a sum of a first height of the first semiconductor die, a second height of the second semiconductor dies, and a third height of the conductive terminals.

* * * * *